United States Patent
Lee et al.

(10) Patent No.: US 10,665,172 B2
(45) Date of Patent: May 26, 2020

(54) GATE DRIVER AND DISPLAY PANEL USING THE SAME

(71) Applicant: LG Display Co., Ltd., Seoul (KR)

(72) Inventors: Jung Min Lee, Paju-si (KR); Jin Hwan Kim, Paju-si (KR); Woo Chan Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 137 days.

(21) Appl. No.: 15/618,387

(22) Filed: Jun. 9, 2017

(65) Prior Publication Data

US 2018/0144688 A1    May 24, 2018

(30) Foreign Application Priority Data

Nov. 21, 2016    (KR) .................. 10-2016-0155311

(51) Int. Cl.
*G09G 3/3266*    (2016.01)
*G11C 19/28*    (2006.01)
(Continued)

(52) U.S. Cl.
CPC ......... *G09G 3/3266* (2013.01); *G09G 3/3225* (2013.01); *G11C 19/184* (2013.01);
(Continued)

(58) Field of Classification Search
CPC .... G09G 3/3266; G09G 3/3225; G09G 3/003; G09G 2310/0221; G09G 2310/0218;
(Continued)

(56) References Cited

U.S. PATENT DOCUMENTS 5,223,824 A * 6/1993 Takeda ................. G09G 3/3611
345/93
5,801,672 A * 9/1998 Masuda ............... G09G 3/3648
345/98
(Continued)

FOREIGN PATENT DOCUMENTS

CN        101122720 A    2/2008
CN        105374318 A    3/2016
(Continued)

OTHER PUBLICATIONS

European Search Report for European Patent Application No. EP 17178316, dated Jan. 19, 2018, 24 Pages.
(Continued)

*Primary Examiner* — Grant Sitta
(74) *Attorney, Agent, or Firm* — Fenwick & West LLP

(57) ABSTRACT

A display panel includes a first plurality of pixels in first pixel rows corresponding to a first plurality of gate lines, a second plurality of pixels in second pixel rows corresponding to a second plurality of gate lines, and a gate driver coupled to the first plurality of gate lines and the second plurality of gate lines, the gate driver is configured to in a first display mode, turn on the first plurality of pixels and the second plurality of pixels, and in a second display mode, turn off the first plurality of pixels and turn on the second plurality of pixels. By turning off the pixels in the plurality of rows disposed in the dark areas, the number of the pixels to be driven can be reduced while obtaining a sufficient pixel compensation time, thereby driving the display panel at high speed.

14 Claims, 14 Drawing Sheets

(51) Int. Cl.
  *G11C 19/18*    (2006.01)
  *G09G 3/3225*   (2016.01)
  *G09G 3/00*     (2006.01)

(52) U.S. Cl.
  CPC ............. *G11C 19/28* (2013.01); *G09G 3/003* (2013.01); *G09G 2300/0426* (2013.01); *G09G 2310/0213* (2013.01); *G09G 2310/0218* (2013.01); *G09G 2310/0221* (2013.01); *G09G 2310/0232* (2013.01); *G09G 2310/0286* (2013.01); *G09G 2310/04* (2013.01); *G09G 2310/062* (2013.01); *G09G 2310/08* (2013.01); *G09G 2330/023* (2013.01); *G09G 2354/00* (2013.01)

(58) Field of Classification Search
  CPC ......... G09G 2330/023; G09G 2310/04; G09G 2354/00; G09G 2310/08; G09G 2310/0286; G09G 2310/0213; G09G 2300/0426; G09G 2310/0232; G09G 2310/062; G09G 3/20; G09G 3/3258; G11C 19/00; G11C 19/28; G11C 19/184
  See application file for complete search history.

(56) References Cited

U.S. PATENT DOCUMENTS

| | | | | |
|---|---|---|---|---|
| 5,867,140 A * | 2/1999 | Rader | ............... | G09G 5/363 345/98 |
| 5,877,733 A * | 3/1999 | Uchida | ............... | G06F 3/147 345/33 |
| 6,181,313 B1 * | 1/2001 | Yokota | ............... | G09G 3/36 345/100 |
| 6,229,516 B1 * | 5/2001 | Kim | ............... | G09G 3/3666 345/103 |
| 6,590,573 B1 * | 7/2003 | Geshwind | ............... | G06T 19/00 345/419 |
| 7,034,816 B2 * | 4/2006 | Yatabe | ............... | G09G 3/367 345/212 |
| 7,161,568 B2 * | 1/2007 | Park | ............... | G09G 3/3648 345/204 |
| 7,932,894 B2 * | 4/2011 | Oakley | ............... | G06F 1/1662 345/169 |
| 9,134,825 B2 * | 9/2015 | Chaji | ............... | G06F 3/038 |
| 9,325,311 B1 * | 4/2016 | Konoshita | ............... | H03K 17/687 |
| 9,548,032 B2 | 1/2017 | Sun | ............... | G09G 3/3648 |
| 9,606,607 B2 * | 3/2017 | Chaji | ............... | G06F 1/3265 |
| 9,607,428 B2 * | 3/2017 | Li | ............... | G02B 27/017 |
| 10,290,156 B2 * | 5/2019 | Patel | ............... | G06T 19/20 |
| 2001/0052888 A1 * | 12/2001 | Hebiguchi | ............... | G09G 3/3666 345/87 |
| 2002/0190944 A1 | 12/2002 | Morita | | |
| 2003/0222866 A1 * | 12/2003 | Funston | ............... | G06F 1/3228 345/211 |
| 2005/0041002 A1 * | 2/2005 | Takahara | ............... | G09G 3/2003 345/76 |
| 2006/0061540 A1 * | 3/2006 | Harada | ............... | G09G 3/3677 345/103 |
| 2008/0002803 A1 * | 1/2008 | Kim | ............... | G09G 3/3674 377/64 |
| 2008/0284719 A1 * | 11/2008 | Yoshida | ............... | G02F 1/136277 345/102 |
| 2010/0188375 A1 | 7/2010 | Lee et al. | | |
| 2012/0113498 A1 * | 5/2012 | Margerm | ............... | G09G 3/3426 359/290 |
| 2013/0293597 A1 * | 11/2013 | Mori | ............... | G09G 3/007 345/690 |
| 2014/0354624 A1 * | 12/2014 | Chaji | ............... | G06F 1/3265 345/212 |
| 2015/0138251 A1 * | 5/2015 | Pyo | ............... | G09G 3/3233 345/690 |
| 2015/0309312 A1 * | 10/2015 | Alton | ............... | G02B 27/0172 345/592 |
| 2016/0103326 A1 | 4/2016 | Kimura et al. | | |
| 2016/0267716 A1 * | 9/2016 | Patel | ............... | G09G 5/395 |
| 2016/0334923 A1 * | 11/2016 | Chan | ............... | G09G 3/3677 |
| 2017/0004648 A1 * | 1/2017 | Li | ............... | G02B 27/017 |
| 2017/0025068 A1 | 1/2017 | Jeoung et al. | | |
| 2017/0038588 A1 * | 2/2017 | Passmore | ............... | G06T 15/50 |
| 2017/0053606 A1 * | 2/2017 | Min | ............... | G09G 3/3426 |
| 2017/0076425 A1 * | 3/2017 | Folse | ............... | G02B 27/0179 |
| 2017/0076683 A1 * | 3/2017 | Lee | ............... | G11C 19/28 |
| 2017/0148420 A1 * | 5/2017 | Gao | ............... | G09G 5/391 |
| 2017/0154574 A1 * | 6/2017 | Chaji | ............... | G06F 1/3265 |
| 2017/0193895 A1 * | 7/2017 | Ng | ............... | G09G 5/022 |
| 2017/0221411 A1 * | 8/2017 | Chang | ............... | G09G 3/20 |
| 2017/0236466 A1 * | 8/2017 | Spitzer | ............... | G09G 3/2085 345/560 |
| 2018/0075808 A1 * | 3/2018 | Yamashita | ............... | G09G 3/3266 |
| 2018/0075811 A1 * | 3/2018 | Wacyk | ............... | G09G 3/3233 |
| 2018/0197480 A1 * | 7/2018 | Choi | ............... | G09G 3/3266 |

FOREIGN PATENT DOCUMENTS

| | | | | |
|---|---|---|---|---|
| EP | 3118844 | 1/2017 | | |
| JP | 4470507 B2 | 8/2005 | | |
| JP | 2005221695 A | 8/2005 | | |
| WO | WO 2015137709 | 9/2015 | | |
| WO | WO-2015137710 A1 * | 9/2015 | ............. | G11C 19/28 |

OTHER PUBLICATIONS

Partial European Search Report for European Patent Application No. EP 17178316.0, dated Aug. 22, 2017, 18 Pages.
China National Intellectual Property Administration, Notification of the First Office Action, CN Patent Application No. 201710507399.6, dated Mar. 26, 2020, 22 pages.

* cited by examiner

GATE DRIVER AND DISPLAY PANEL USING THE SAME

CROSS-REFERENCE TO RELATED APPLICATIONS

This application claims the priority of Korean Patent Application No. 10-2016-0155311 filed on Nov. 21, 2016, in the Korean Intellectual Property Office, the disclosure of which is incorporated herein by reference in its entirety.

BACKGROUND

Technical Field

The present disclosure relates to a gate driver and a display panel using the same, and more particularly, to a gate driver in which transistors for turning off unnecessary pixels for high-speed driving are disposed, and a display panel using the same.

Description of the Related Art

As information technology has developed display devices have been developed that can represent information contained in electrical signals in the form of visual images. Display devices are used for viewing, enjoying and sharing not only for merely images but also various contents such as documents, photographs and videos. And, a display device for providing users with virtual reality or augmented reality experience are being developed, in which images or videos are digitally reproduced so that the users can feel as if it is real. Virtual reality (VR) represents digital or virtual image information without the visual input of the real world, while augmented reality (AR) is a type of virtual reality, which synthesizes virtual image information on the basis of the real world, so that it looks like an object existing in the real environment.

A variety of display devices may be used for implementing virtual reality, such as a liquid-crystal display device (LCD), a plasma display panel device (PDP), a field emission display device (FED), an electrophoretic display device (EPD), an electro-wetting display device (EWD), and an organic light-emitting display device (OLED).

The above-mentioned display devices are classified by the type of display panel. Various display panels include a pixel array for displaying an image, a data driver for supplying data signals to data lines connected to the pixel array, a gate driver for sequentially supplying gate signals to the gate lines of the pixel array in synchronization with a gate signal, etc.

Each of the pixels may include a thin-film transistor (TFT) that supplies a voltage of a data line to a pixel electrode in response to a gate signal supplied via a gate line. The gate signal swings between a gate high voltage VGH and a gate low voltage VGL. A p-type thin-film transistor is turned on in response to the gate low voltage, while an n-type thin-film transistor is turned on in response to the gate high voltage.

The gate driver may be embedded in the display panel together with the pixel array. The gate driver embedded in the display panel is known as a GIP (Gate In Panel) circuit. The GIP circuit includes a shift register. The shift register may include stages that can generate an output in response to a start pulse and shift the output according to a clock.

The stages of the shift register include a Q node that charges a gate electrode, a QB (Q Bar) node that discharges the gate electrode, and a switch circuit that is connected to the Q node and the QB node. The switch circuit may charge the Q node in response to the start pulse or the output of the previous stage to raise the voltage at the gate electrode, and discharge the QB node in response to an output from the next stage or a reset pulse. The switch circuit may include a p-type or n-type transistor.

As mentioned above, in order to implement virtual reality using various display devices, it is necessary to drive a plurality of pixels arranged on the screen at high speed. To this end, the design of a GIP circuit is being studied.

SUMMARY

The screen of a display device for implementing virtual reality can benefit from being driven at a high speed higher than a normal driving speed of 60 Hz. For example, the driving speed of 75 Hz or higher can be used high speed driving. For an organic light-emitting diode display device, due to the characteristics of a driving transistor for accurately applying a driving current to pixels according to gray levels or due to deterioration of the organic light-emitting diode, a process of compensating for pixels is carried out. Since the pixels are compensated in real time during a sampling period before light emission, the sampling period inevitably becomes shorter as the driving speed increases. Accordingly, in order to obtain a sufficient compensation time, there has been proposed a scheme of turning off pixels in a part of the display device that are disposed out of the user's view. That is, all the pixels of the display device can be turned on when the display device is used for normal use while unnecessary pixels can be turned off when the display device is used for virtual reality.

In view of the above, an embodiment of the present disclosure relates to a driving circuit for turning off pixels located out of the user's view, and a display panel employing such a driving circuit.

An object of an embodiment of the present disclosure is to provide a display panel including a driving circuit for turning off pixels disposed at the upper portion of the display panel.

Another object of an embodiment of the present disclosure is to provide a display panel including a driving circuit for turning off pixels disposed at the lower portion of the display panel.

Another object of an embodiment of the present disclosure is to provide a driving circuit for turning off pixels disposed at certain rows of the display panel.

It should be noted that objects of the present disclosure are not limited to the above-described objects, and other objects of the present disclosure will be apparent to those skilled in the art from the following descriptions.

According to an aspect of the present disclosure, there is provided a display panel including a substrate comprising a first area and a second area, pixels arranged in a plurality of rows on the substrate, a plurality of gate lines for providing gate signals to the pixels in the plurality of rows, and a gate driver for driving the plurality of gate lines. The gate driver includes transistors for turning off pixels connected to the row disposed in the second area. By turning off the pixels in the plurality of rows disposed in the dark areas, the number of the pixels to be driven can be reduced while obtaining pixel compensation time, thereby driving the display panel at high speed.

According to another aspect of the present disclosure, there is provided a display panel including a substrate comprising a plurality of gate lines for providing gate signals to pixels in a plurality of rows, a gate driver for driving the plurality of gate lines, wherein the gate driver comprises a $k^{th}$ stage that provides a signal input to one of the gate lines in a $k^{th}$ row, wherein k is a natural number equal to or larger than two, and a cut-off transistor for blocking an output signal from a $(k-1)^{th}$ stage input to the $k^{th}$ stage. By turning off the pixels after the $k^{th}$ row, the number of the pixels to be driven can be reduced while obtaining pixel compensation time, thereby driving the display panel at high speed.

According to another aspect of the present disclosure, there is provided a gate driver included a scan driver and an emission driver, wherein the scan driver comprises n scan stages, and the emission driver comprises n emission stages, wherein n is a natural number, wherein the gate driver, in each of the scan driver and the emission driver, comprises a first cut-off transistor that blocks an output signal from a $(j-1)^{th}$ scan stage or a $(j-1)^{th}$ emission stage, wherein j is a natural number satisfying $1 \leq j < n$, a second cut-off transistor that blocks an output signal from a $k^{th}$ scan stage or a $k^{th}$ emission stage, wherein k is a natural number satisfying $1 \leq j < k \leq n$, and a control transistor that controls a start pulse voltage to a $(k+1)^{th}$ scan stage or a $(k+1)^{th}$ emission stage. By turning off the pixels from the pixel in the $j^{th}$ row to the pixel in the $k^{th}$ row, the number of the pixels to be driven can be reduced while obtaining pixel compensation time, thereby driving the display panel at high speed.

According to another aspect of the present disclosure, a display panel comprises a first plurality of pixels in first pixel rows corresponding to a first plurality of gate lines, a second plurality of pixels in second pixel rows corresponding to a second plurality of gate lines, and a gate driver coupled to the first plurality of gate lines and the second plurality of gate lines, the gate driver is configured to in a first display mode, turn on the first plurality of pixels and the second plurality of pixels, and in a second display mode, turn off the first plurality of pixels and turn on the second plurality of pixels.

The exemplary embodiments of the present disclosure will be described in the detail description with reference to the accompanying drawings.

According to one or more exemplary embodiments of the present disclosure, by disposing the control transistors for adjusting the start pulse voltage input to the $k^{th}$ stages and/or the cut-off transistors for blocking signals input to the $k^{th}$ stage output from the $(k-1)^{th}$ stage, the number of the pixels to be turned on or off after the $k^{th}$ row can be reduced while obtaining pixel compensation time, thereby driving the display panel at high speed. And, the same pixel compensation time as that of the normal driving speed can be maintained while performing high-speed driving.

In addition, according to one or more exemplary embodiments of the present disclosure, by disposing the auxiliary transistor for turning on the output transistors connected to the gate high voltage in the stage, it is possible to turn off the pixels in the rows connected to the stage where the auxiliary transistor is disposed when the enable signal is applied. As a result, the number of the pixels to be driven can be reduced while obtaining pixel compensation time, thereby driving the display panel at high speed.

Moreover, according to one or more exemplary embodiments of the present disclosure, by disposing the first auxiliary transistor and the second auxiliary transistor in the stages disposed in the row to turn off the pixels such that the gate electrode of the first auxiliary transistor and the gate electrode of the second auxiliary transistor are connected to the enable line to receive the same signal, it is possible to turn off the pixels in the row connected to the stages where the auxiliary transistors are disposed when the enable signal is applied. As a result, the number of the pixels to be driven can be reduced while obtaining pixel compensation time, thereby driving the display panel at high speed.

In addition, according to one or more exemplary embodiments of the present disclosure, by disposing the first auxiliary transistor and the second auxiliary transistor at the input terminal of the start pulse voltage of the stages to control a signal inputted to the stages disposed in the row to turn off the pixels, it is possible to turn off the pixels in the row connected to the emission stage when the enable signal is applied. As a result, the number of the pixels to be driven can be reduced while obtaining pixel compensation time, thereby driving the display panel at high speed.

The summary is not intended to specify essential features of the appended claims, and thus the scope of the claims is not limited thereby.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
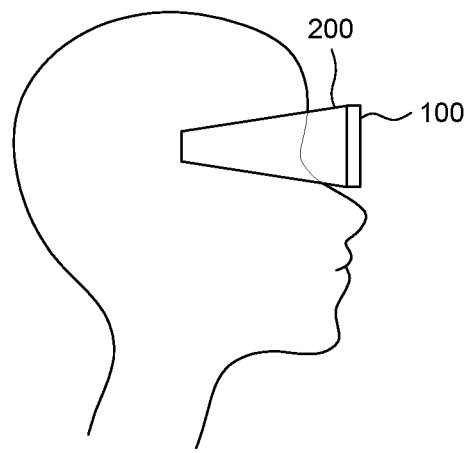
FIG. 1 is a view showing a display device used for implementing virtual reality worn by a user.

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. And, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B," and "an element A next to an element B," another element C may be disposed between the elements A and B unless the term "directly" or "immediately" is explicitly used.

In describing temporal relationship, terms such as "after," "subsequent to," "next to" and "before" are not limited to "directly after," "directly subsequent to," "immediately next to" "immediately before," and so on, unless otherwise specified.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, a display device according to an exemplary embodiment of the present disclosure will be described in detail with reference to the accompanying drawings.

FIG. 1 is a view showing a display device used for implementing virtual reality worn by a user.

The above-mentioned, various display devices 100 may also be used for implementing virtual reality. In implementing virtual reality, it is advantageous to utilize a light and small display device 100 which can move together with the movement of the user's head or eyes because the device shows a spatial image based on the direction and position the user watches. Accordingly, among the display devices 100, a mobile or small tablet PC may be employed.

To utilize a display device 100 for viewing documents or videos as a device for implementing virtual reality, it has to be fixed in front of the user's eyes. Therefore, a structure 200 for fixing the display device 100 is required. The structure may be produced with various materials and in various shapes, and the distance between the display device 100 and the user's eyes can be adjusted so that the virtual reality can be implemented appropriately.

That is, by utilizing the display device 100 that user is already using, users can easily enjoy virtual reality contents without additionally incurring the cost for purchasing virtual reality equipment.

Figure 2:
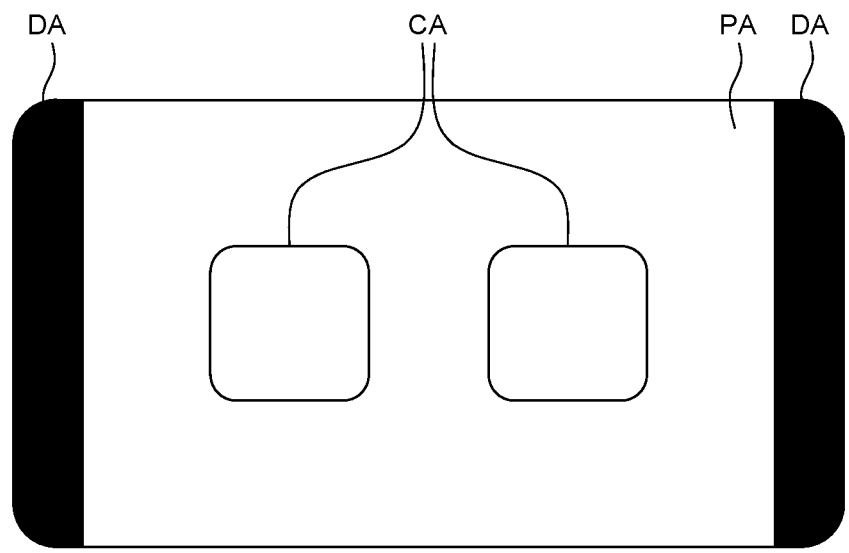
FIG. 2 is a view showing a display device according to an exemplary embodiment of the present disclosure.

FIG. 2 is a view showing a display device 100 according to an exemplary embodiment of the present disclosure.

The human viewing angle is about 200°, but the actual viewing range is 120° to 140°. Accordingly, when the display device 100 is fixed in front of the user's eyes, the user can see the center area CA where the eyes are substantially located and a part of the peripheral area PA only but cannot recognize the dark areas DA at the left and right portions of the display device 100. In addition, since the distance between the display device 100 and the user's eyes is closer than when the display device 100 is used for normal use, the user can recognize the resolution of the display device 100 more clearly.

That is, when a screen for implementing virtual reality is displayed on the display device 100, it is necessary to separately manage the display area of the display device 100, so that pixels in the central area CA should not have a dark spot or a bright spot and pixels in the peripheral area PA should have an image quality equivalent to an image displayed when the display device 100 is used for normal use. In addition, a black screen can be implemented by turning off the pixels located in the dark areas DA that the user cannot recognize so that no image is displayed in the dark area DA. By doing so, it is possible to save the power consumption by not driving a part of the display device 100, and more advantageously it is possible to drive the screen at high speed.

The driving speed of the display device 100 used for normal use is about 60 Hz, but a driving speed of about 75 Hz or higher is required to implement virtual reality. As the driving speed increases, moving images are overlapped due to an image sticking effect and blurring of the moving images is worsened. Therefore, by decreasing the time period in which images remain on the screen to minimize overlaps of the images, users can feel as if the response speed is faster. Typically, persistence time is 16 ms when a display device is driven at 60 Hz. When a display device is driven at 75 Hz or higher, it is possible to prevent motion blur by reducing the persistence time to 2 ms. This may be referred to as Low Persistency (LP). In the following description, a method using this will be referred to as an LP mode or a virtual reality mode.

And, if an organic light-emitting panel is employed in the display device 100 for realizing the LP mode, a sufficient time for compensating in real time the driving circuit for driving the pixels and the organic light-emitting diode has to be obtained. As the driving speed increases, the time for displaying one frame on the screen is reduced, and the time for driving the individual pixels is also reduced, there may not be sufficient pixel compensation time. Therefore, by driving only a necessary part and not driving the unnecessary part of the screen, a sufficient pixel compensation time can be obtained. And, the same pixel compensation time as that of the normal driving speed of 60 Hz can be maintained while performing high-speed driving. Accordingly, in order to obtain the compensation time, a scheme of turning off pixels in a part of the display device that are disposed out of the user's view is proposed.

When the display device 100 is used for normal use such as watching images or videos, it is operated in a normal mode, and when the display device 100 is used as a device for implementing virtual reality, it is operated in the LP mode. In the LP mode, the driving speed is increased, the persistent time is reduced, and the pixels arranged in the dark areas DA are turned off, thereby facilitating high-speed driving of the screen.

Figure 3:
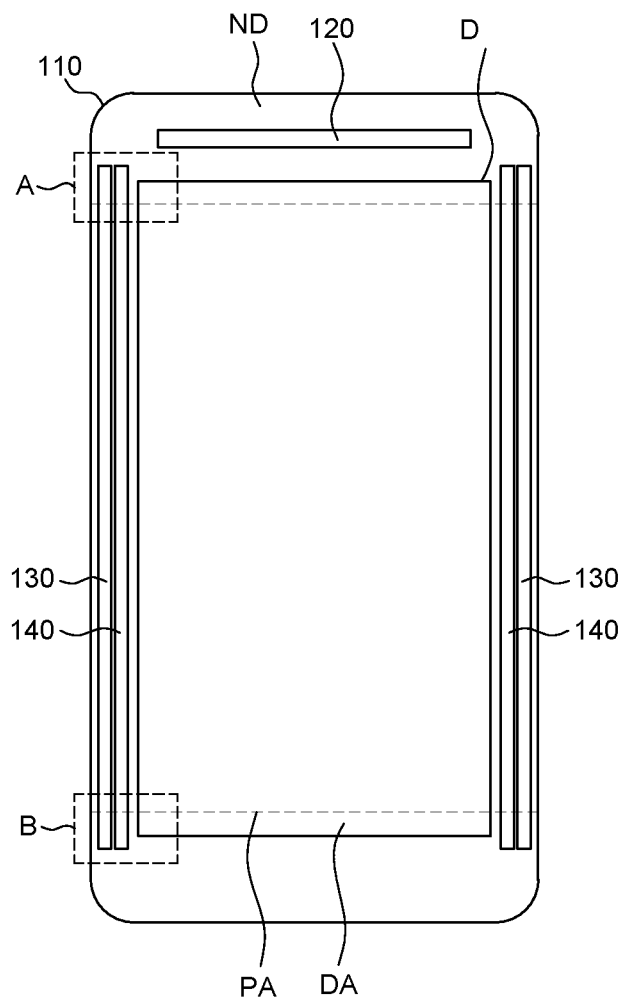
FIG. 3 is a view showing a display panel according to an exemplary embodiment of the present disclosure.

FIG. 3 is a view showing a display panel according to an exemplary embodiment of the present disclosure.

The display panel shown in FIG. 3 may be used to implement the display device 100 mentioned above with respect to FIG. 2. The display panel includes a substrate 110 divided into a display area D where a plurality of pixels are arranged for displaying images, and a non-display area ND where no image is displayed. The non-display area ND surrounding the display area D may be disposed a dummy pixel that does not emit light.

Each of the plurality of pixels arranged in the display area D operates by receiving a data signal and a gate signal via a data line and a gate line, respectively. The data line may be connected to a data driver 120 disposed at an upper portion of the substrate 110 to receive a signal. The data driver 120 may be mounted on the substrate 110 in the form of a driver-IC. And, it is to be understood that the data driver 120 may be disposed at other positions in different forms.

The gate lines may include an emission line for controlling a gate electrode of a transistor that controls light emission of the pixel. The emission line may be connected to an emission driver 140 to receive an emission signal. The gate lines may further include a scan line for controlling a gate electrode of a switching scan transistor that switches signals, in addition to the emission transistor that controls light emission of a pixel. The scan line may be generally referred to as a gate line. The scan line is connected to a scan driver 130 to receive a scan signal.

The scan driver 130 and the emission driver 140 may be collectively referred to as a gate driver. The gate driver may be a GIP circuit formed by being directly deposited on the substrate 110. The gate driver may be, but is not limited to, symmetrically designed on the left and right sides.

In the LP mode for implementing virtual reality, the display panel is required to be able to turn off pixels disposed in a part of the display area D. In implementing virtual reality, a screen is displayed by rotating the display panel shown in FIG. 3 by 90 degrees clockwise or counterclockwise. Thus, the display panel shown in FIG. 3 is requested to turn off the pixels disposed in a part of the upper portion and the lower portion of the display panel. That is, the dark areas DA may be defined above and below the peripheral area PA including the center area CA. The dark areas DA including a part of the display area D may be referred to as a second area, and the peripheral area PA including the center area CA may be referred to as a first area.

The pixels in the dark area DA operate in the LP mode while the pixels in the peripheral area PA operate in the normal mode. The gate driver for operating the pixels in the LP mode and the normal mode will be described with reference to a block diagram showing a region A located at the boundary between the peripheral area PA and the dark area DA, i.e., at the left upper portion of the display panel, and a block diagram showing a region B located at the left lower portion of the display panel.

Figure 4A:
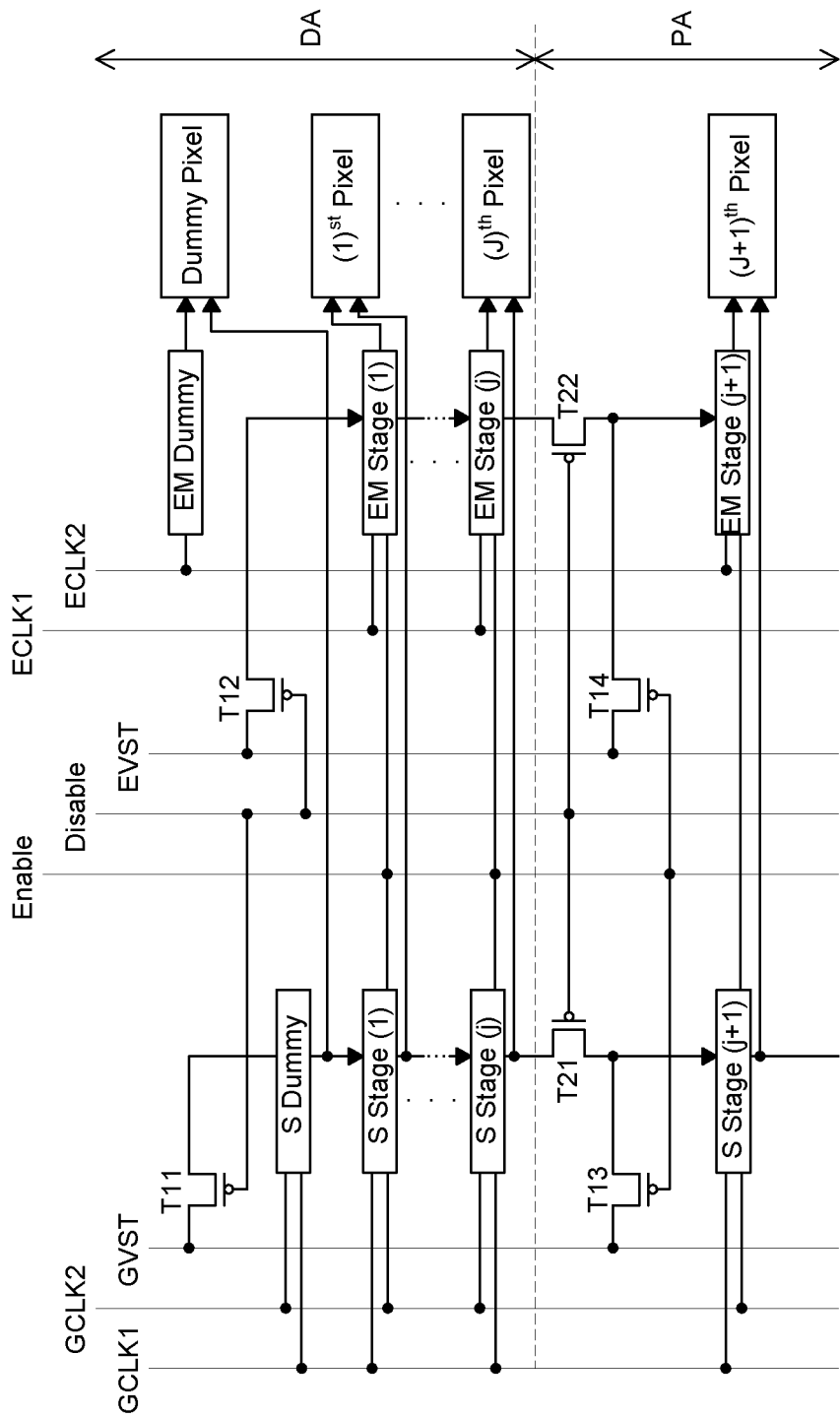
FIG. 4A is an enlarged block diagram of the region A of FIG. 3.

FIG. 4A is an enlarged block diagram of the region A of FIG. 3.

In the display panel on which pixels are arranged inn pixel rows, a gate driver composed of at least n cascaded gate driver stages for sequentially transmitting gate signals to the respective rows is disposed, where n is a natural number equal to or greater than two. In detail, the gate driver includes a scan driver 130 and an emission driver 140. The scan driver 130 includes n scan stages S Stage (n), and the emission driver 140 includes n emission stages EM Stage (n). A dummy stage may be disposed before the first stage and after the nth stage. The scan signal provided by the scan driver 130 and the emission signal provided by the emission driver 140 are examples of gate signals.

The structure and functionality of the scan stages are similar to those of the emission stages. There is a difference in that each of the scan stages receives two clock signals to generate an output signal while each of the emission stages receives a single clock signal to generate an output signal. Although the scan stages are shown as a two-phase circuit capable of generating a pulse by using two clock signals, but the scope of the present disclosure is not limited thereto.

Some signals used to operate the scan driver include two gate clock signals, i.e., a gate clock signal 1 GCLK1, a gate clock signal 2 GCLK2, a gate start pulse voltage GVST, a gate high voltage VGH, and a gate low voltage VGL.

Similar to the signals input to the scan driver, some signals used to operate the emission driver include two emission clock signals, i.e., an emission clock signal 1 ECLK1 and an emission clock signal 2 ECLK2, an emission start pulse voltage EVST, an emission high voltage VEH, and an emission low voltage VEL.

When these signals are applied to each of the stages as input signals, each stage may generate an output signal to control the driving of the pixels arranged in each row in a sequential manner.

The stages operate in a cascade manner such that each stage receives an output signal from its previous stage. Therefore, by controlling the input signals to the stages of a certain row, it is possible to turn off pixels arranged in the row. Likewise, by controlling the input signals to the stages of a certain row, it is possible to turn on pixels arranged in the row. Accordingly, lines for applying enable signals Enable and disable signals Disable are arranged in the gate driver so as to control the on/off state of pixels arranged after a certain row, which may be referred to as an enable line and a disable line, respectively.

In the following description, the transistors used in the circuits are assumed as p-type transistors as an example. Accordingly, the enable line is activated in the LP mode and is applied with low voltage, while the disable line is deactivated in the LP mode and is applied with high voltage.

The display panel includes n pixel rows, n scan lines, and n emission lines. Each pixel row is connected to a corresponding a gate line that is a scan line and an emission line. Pixel rows 1 to j are connected to scan lines 1 to j and emission lines 1 to j. Scan lines 1 to j are driven by scan driver stages 1 to j. Emission lines 1 to j are driven by emission driver stages 1 to j. Pixel rows j+1 to k are connected to scan lines j+1 to k and emission lines j+1 to k. Scan lines j+1 to k are driven by scan driver stages j+1 to k. Emission lines j+1 to k are driven by emission driver stages j+1 to k. Pixel rows k+1 to n are connected to scan lines k+1 to n and emission lines k+1 to n. Scan lines k+1 to n are driven by scan driver stages k+1 to n. Emission lines k+1 to n are driven by emission driver stages k+1 to n.

The high level operation of the gate driver is as follows. During the normal mode, scan stages 1 to n sequentially drive a scan signal (e.g. a scan pulse) to all of the scan lines 1 to n during a frame period. Additionally, emission stages 1 to n sequentially drive an emission signal (e.g. an emission pulse) to all of the emission lines 1 to n during a frame period. The driving of the emission lines and scan lines causes the pixels in both the dark area DA and the peripheral area PA to be turned on. In one embodiment, the frame period is the period of time between adjacent vertical synchronization (VSYNC) pulses.

However, in the LP mode, only scan stages j+1 to k sequentially drive the scan signal to scan lines j+1 to k during a frame period. Scan stages 1 to j and k+1 to n provide a direct current (DC) voltage to the scan lines 1 to j and k+1 to n throughout each frame period. Additionally, only emission stages j+1 to k sequentially drive the emission signal to emission lines j+1 to k during a frame period. The emission stages 1 to j and k+1 to n provide a DC voltage to the emission lines 1 to j and k+1 to n throughout each frame period. Thus, during the LP mode, a DC voltage is provided to gate lines of pixel rows that are in the dark area DA. The DC voltage is set to a voltage level that maintains the pixel rows in the dark area DA off throughout each frame period. The driving operation also causes the pixel rows in the peripheral area PA to be turned on.

In detail, if the pixel in the first row $1^{st}$ Pixel to the pixel in the $j^{th}$ row $j^{th}$ Pixel are to be turned off, where j is a natural number satisfying 1<j<n, the gate driver includes first control transistors T11 and T12 for controlling the start pulse voltages input to the first stages.

For the scan stages, the first control transistor T11 selectively controls whether the start pulse voltage GVST reaches the input of dummy scan stage S Dummy. An electrode of the first control transistor T11 is connected to the start pulse voltage line to which the gate start pulse voltage GVST is applied, and another electrode thereof is connected to an input terminal of the first scan stage S Stage (1) or the dummy scan stage S Dummy to apply an input signal thereto. The gate electrode of the first control transistor T11 is connected to the line to which the disable signal is applied. Since high voltage is applied to the disable line during the LP mode, the first control transistor T11 is turned off so that the gate start pulse voltage GVST is not applied to the first scan stage S Stage (1). Accordingly, a normal output signal is not generated in the first scan stage S stage (1) and the succeeding scan stages. As a result, a normal driving signal is not input to the pixel in the first row $1^{st}$ Pixel and in the pixels in the succeeding rows, thereby blocking signals applied to the pixels.

Similarly, for the emission stages, the first control transistor T12 selectively controls whether the start pulse voltage EVST reaches the input of dummy emission stage EM Dummy. An electrode of the first control transistor T12 is connected to the start pulse voltage line to which the emission start pulse voltage EVST is applied, and another electrode thereof is connected to the input terminal of the first emission stage EM Stage (1) or the dummy emission stage EM Dummy to apply an input signal. The gate electrode of the first control transistor T12 is connected to the line to which the disable signal is applied. By doing so, it is possible to block the normal driving signal applied to the emission line connected to the pixel in the first row $1^{st}$ Pixel and the pixels in the succeeding rows.

Therefore, by disposing the first control transistors for controlling the start pulse voltages applied to the input terminals of the first scan stage S stage (1) and the first emission stage EM stage (1), it is possible to block the normal driving signal applied to the pixel in the first row $1^{st}$ Pixel and the pixels in the succeeding rows to turn off the pixels.

This applies to the pixel in the $j^{th}$ row $j^{th}$ Pixel. Then, to turn on the pixels from the pixel in the $(j+1)^{th}$ row $(j+1)^{th}$ Pixel, it is necessary to apply the start pulse voltage again to the $(j+1)^{th}$ stage. This can be done by disposing the second control transistors T13 and T14 at the input terminals of the $(j+1)^{th}$ stages, respectively.

For the scan stages, a second control transistor T13 selectively controls whether the gate start pulse voltage GVST is provided to the input of the $(j+1)^{th}$ scan stage S Stage (j+1). An electrode of the second control transistor T13 is connected to the line to which the gate start pulse voltage GVST is applied, and another electrode thereof is connected to an input terminal of a $(j+1)^{th}$ scan stage S Stage (j+1) to apply an input signal thereto. The gate electrode of the second control transistor T13 is connected to the enable line. Since low voltage is applied to the enable line during the LP mode, the second control transistor T13 is turned on so that the gate start pulse voltage GVST is applied to the $(j+1)^{th}$ scan stage S Stage (j+1). As a result, it is possible to output the normal driving signal from the $(j+1)^{th}$ scan stage.

Similarly, for the emission stages, a second control transistor T14 selectively controls whether the emission start pulse voltage EVST is provided to the input of the $(j+1)^{th}$ emission stage EM Stage (j+1). An electrode of the second control transistor T14 is connected to the line to which the emission start pulse voltage EVST is applied, and another electrode thereof is connected to the input terminal of the first emission stage EM Stage (1) to apply an input signal. The gate electrode of the second control transistor T14 is connected to the enable line. The second control transistor T14 is turned on by the enable signal, such that the emission start pulse voltage EVST is applied to the $(j+1)^{th}$ emission stage EM Stage (j+1). As a result, it is possible to output the normal driving signal from the $(j+1)^{th}$ emission stage.

Therefore, by disposing the second control transistors for controlling the start pulse voltages applied to the input terminals of the $(j+1)^{th}$ scan stage S stage (j+1) and the $(j+1)^{th}$ emission stage EM stage (j+1), it is possible to apply the normal driving signal to the pixel in the $(j+1)^{th}$ row $(j+1)^{th}$ Pixel and the pixels in the succeeding rows to turn on the pixels.

In addition, to normally operate the pixels from the $(j+1)^{th}$ row $(j+1)^{th}$ Pixel, it is necessary to selectively block the input signal input to the $(j+1)^{th}$ stage from the $j^{th}$ stage. Accordingly, cut-off transistors T21 and T22 may be disposed at the input terminal of the $(j+1)^{th}$ stages. In the LP mode, the output signal outputted from the $j^{th}$ stage is blocked from reaching the input terminal of the $(j+1)^{th}$ stage because the output signal outputted from the $j^{th}$ stage is not a normal signal. In the normal mode, the output signal from the $j^{th}$ stage is passed through to the input terminal of the $(j+1)^{th}$ stage.

For the scan stages, an electrode of the first cut-off transistor T21 is connected to an output terminal of the $j^{th}$ scan stage S Stage (j), and another electrode thereof is connected to an input terminal of the $(j+1)^{th}$ scan stage S Stage (j+1). The gate electrode of the first cut-off transistor T21 is connected to the disable line. Since high voltage is applied to the disable line during the LP mode, the first cut-off transistor T21 is turned off, so that the output signal from the $j^{th}$ scan stage S Stage (j) can be blocked.

Similarly, for the emission stages, an electrode of the first cut-off transistor T22 is connected to an output terminal of the $j^{th}$ emission stage EM Stage (j), and another electrode thereof is connected to an input terminal of the $(j+1)^{th}$ emission stage EM Stage (j+1). The gate electrode of the first cut-off transistor T22 is connected to the disable line. The first cut-off transistor T22 is turned off by the disable signal, so that the output signal from the $j^{th}$ emission stage EM Stage (j) can be blocked.

Therefore, by disposing the cut-off transistors for controlling the output signals from the $j^{th}$ scan stage S stage (j) and the $j^{th}$ emission stage EM stage (j) at the input terminals of the $(j+1)^{th}$ scan stage S Stage (j+1) and the $(j+1)^{th}$ emission stage EM Stage (j+1), it is possible to apply the normal driving signals to the pixel in the $(j+1)^{th}$ row $(j+1)^{th}$ Pixel and the pixels in the succeeding rows to turn on the pixels.

Figure 4B:
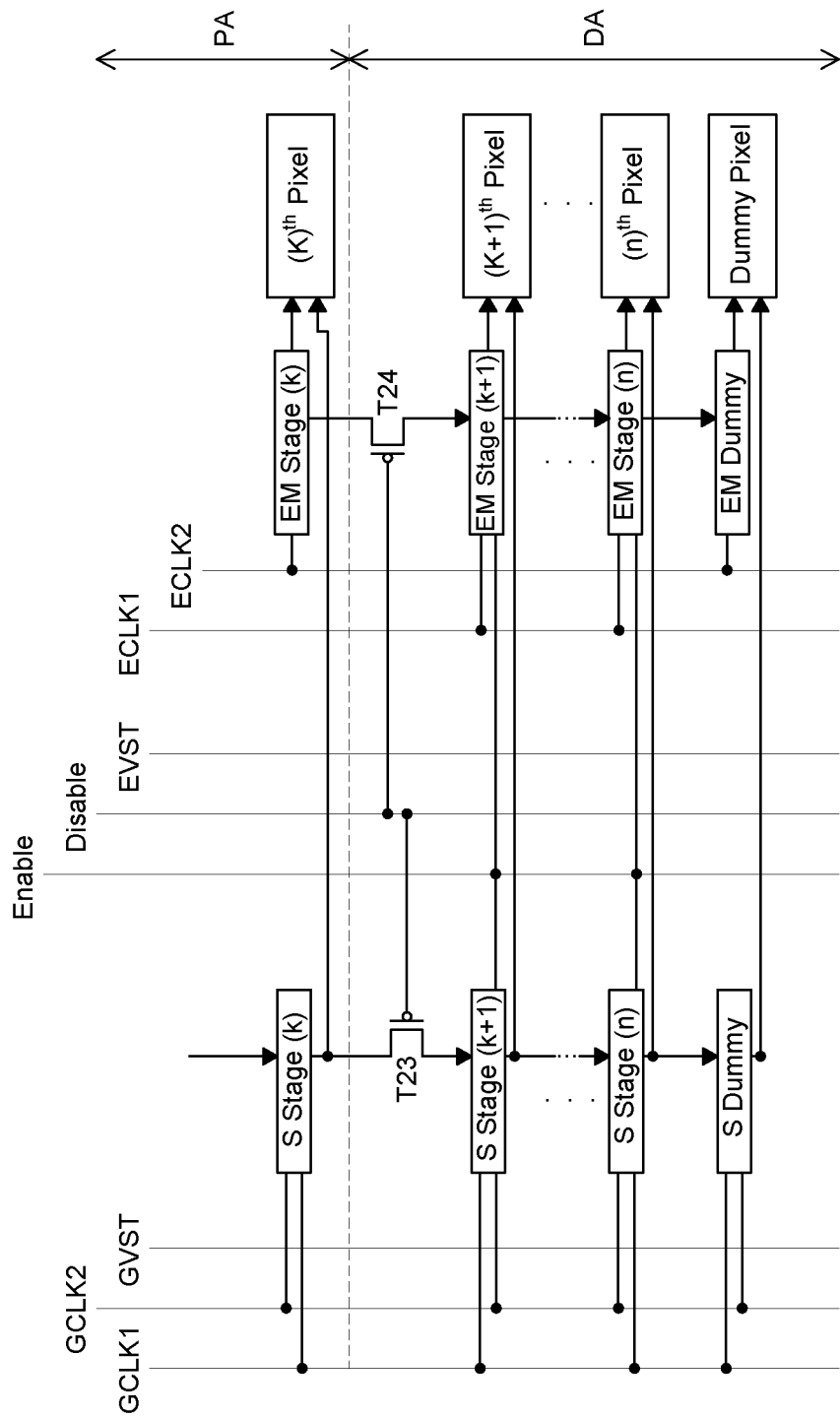
FIG. 4B is an enlarged block diagram of the region B of FIG. 3.

FIG. 4B is an enlarged block diagram of the region B of FIG. 3.

The pixels disposed in the peripheral area PA from the pixel in the $(j+1)^{th}$ row $(j+1)^{th}$ Pixel to the pixel in the $k^{th}$ row $k^{th}$ Pixel are normally operated in the on-state, where k is a natural number satisfying j<k<n. And, to turn off the pixels from the pixel in the $(k+1)^{th}$ row $(k+1)^{th}$ Pixel, cut-off transistors T23 and T24 may be disposed for selectively blocking the output signal from the $k^{th}$ stage from reaching and being input to the $(k+1)^{th}$ stage during the LP mode.

For the scan stages, a second cut-off transistor T23 may be disposed in the scan driver, an electrode of which is connected to an output terminal of the $k^{th}$ scan stage S Stage (k), another electrode of which is connected to an input terminal of the $(k+1)^{th}$ scan stage S Stage (k+1), and the gate electrode of which is connected to the disable line. Since high voltage is applied to the disable line during the LP mode, the second cut-off transistor T23 is turned off, so that the output signal from the $k^{th}$ scan stage S Stage (k) can be blocked.

Similarly, for the emission stages, a second cut-off transistor T24 may be disposed in the emission driver, an electrode of which is connected to an output terminal of the $k^{th}$ emission stage EM Stage (k), another electrode of which is connected to an input terminal of the $(k+1)^{th}$ emission stage EM Stage (k+1), and the gate electrode of which is connected to the disable line. The second cut-off transistor T24 is turned off by the disable signal, so that the output signal from the $k^{th}$ emission stage EM Stage (k) can be blocked.

Therefore, by disposing the cut-off transistors for controlling the output signals from the $k^{th}$ scan stage S stage (k) and the $k^{th}$ emission stage EM stage (k) at the input terminals of the $(k+1)^{th}$ scan stage S Stage (k+1) and the $(k+1)^{th}$ emission stage EM Stage (k+1), it is possible to turn off the pixel in the $(k+1)^{th}$ row $(k+1)^{th}$ Pixel and the pixels in the succeeding rows.

In the exemplary embodiment where the transistors are disposed and operated in the gate driver shown in FIGS. 4A and 4B, by disposing the control transistors for adjusting the start pulse voltage input to the $k+1^{th}$ stages and/or the cut-off transistors for blocking signals input to the $k+1^{th}$ stage output from the $k^{th}$ stage, the number of the pixels to be turned on or off after the $k^{th}$ row can be reduced while obtaining sufficient pixel compensation time, thereby driving the display panel at high speed. And, the same pixel compensation time as that of the normal driving speed of 60 Hz can be maintained while performing high-speed driving.

Although the pixels can be turned off by disposing the control transistors and the cut-off transistors before or after the stage connected to the row in which the pixel to be turned off is disposed, the signals input to the pixels may not be completely blocked, such that a distorted signal may be input to the pixels, as described above. In view of the above, a method for reliably turning off the pixels by additionally disposing transistors so that high voltage is output from each scan stage or emission stage will be described.

Figure 5A:
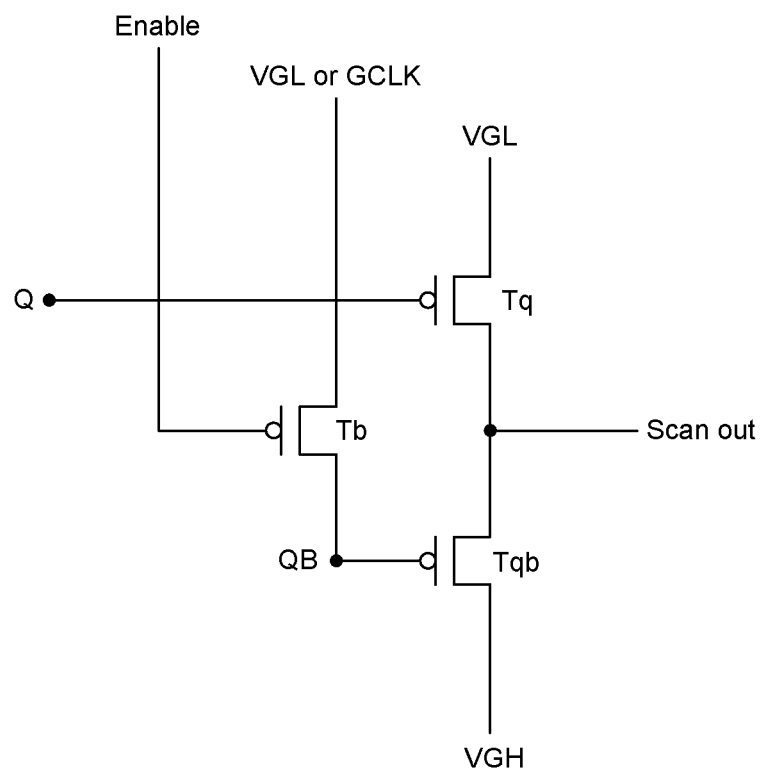
FIG. 5A is a circuit diagram of a stage according to a first exemplary embodiment of the present disclosure included in the dark areas DA of FIGS. 4A and 4B.

FIG. 5A is a circuit diagram of a scan stage according to a first exemplary embodiment of the present disclosure included in the dark areas DA of FIGS. 4A and 4B.

As described above, each stage serves to output low voltage or high voltage in accordance with clock signals. Thus, each stage essentially includes a first output transistor Tq having a Q node that charges the gate electrode, and a second output transistor Tqb having a QB (Q Bar) node that discharges the gate electrode. When high voltage is input to the Q node, low voltage is input to the QB node, and vice versa. That is, the circuit is configured so that different voltages are input to the nodes.

In detail, the first output transistor Tq and the second output transistor Tqb are connected to each other in series. Another electrode of the first output transistor Tq is connected to the gate low voltage VGL, and another electrode of the second output transistor Tqb is connected to the gate high voltage VGH. Accordingly, the first output transistor Tq or the second output transistor Tqb may be selected according to a clock signal so that low voltage or high voltage may be output therefrom. The first output transistor Tq and the second output transistor Tqb connected in series, the Q node and the QB node are commonly disposed in all of the circuits of the stages, and thus a redundant description thereof will be omitted.

To implement black screen in the LP mode, high voltage has to be output from the stages to be transmitted to the pixels. Accordingly, it is necessary to configure the circuit so that the second output transistor Tqb connected to the gate high voltage VGH is turned on in order to output the high voltage in the LP mode. That is, an auxiliary transistor Tb may be disposed in the stage, the gate electrode of which is connected to the enable line, another electrode of which is connected to the QB node, and the other electrode of which connected to the gate low voltage VGL or the gate clock signal GCLK. The auxiliary transistors Tb may also be referred to herein as output control transistors.

Accordingly, when it enters the LP mode, low voltage is applied to the enable signal to turn on the auxiliary transistor Tb. Then, low voltage is applied to the QB node to turn on the second output transistor Tqb, so that high voltage can be output from the stage.

That is, by disposing the auxiliary transistor Tb for turning on the output transistors connected to the gate high voltage in the stage, it is possible to turn off the pixels in the rows connected to the stage where the auxiliary transistor is disposed when the enable signal is applied.

Figure 5B:
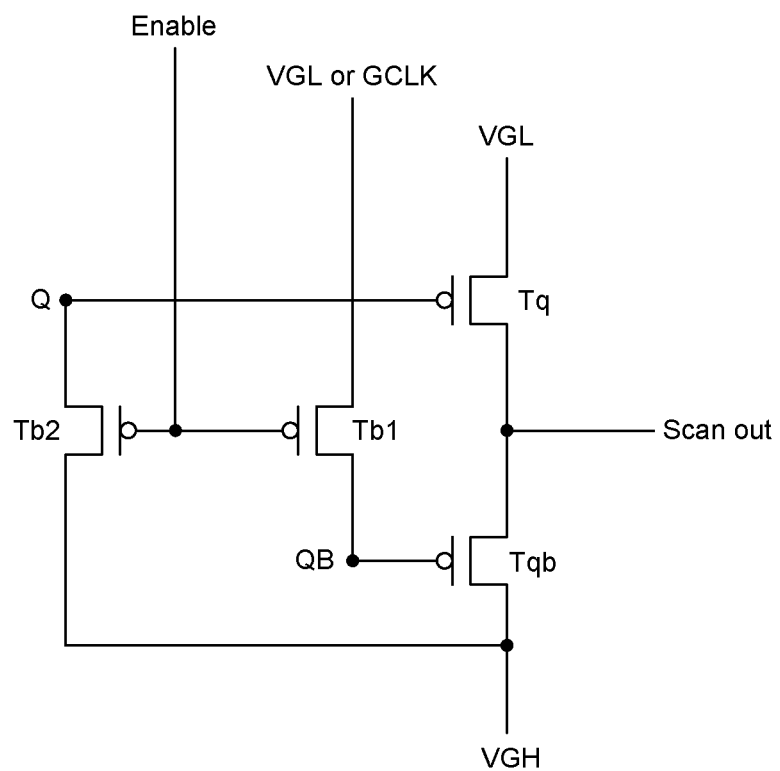
FIG. 5B is a circuit diagram of a stage according to a second exemplary embodiment of the present disclosure included in the dark areas DA of FIGS. 4A and 4B.

FIG. 5B is a circuit diagram of a scan stage according to a second exemplary embodiment of the present disclosure included in the dark areas DA of FIGS. 4A and 4B. The circuit shown in FIG. 5B, which is a modification of the circuit shown in FIG. 5A, can turn off pixels by outputting high voltage when an enable signal Enable is applied in the LP mode, like the circuit shown in FIG. 5A.

The circuit of the stage may include a first auxiliary transistor Tb1 and a second auxiliary transistor Tb2 that have short-circuited gate electrodes which are connected to an enable line. An electrode of the first auxiliary transistor Tb1 may be connected to a QB node, and the other electrode thereof may be connected to a gate low voltage VGL or a gate clock signal GCLK. In addition, an electrode of the second auxiliary transistor Tb2 may be connected to a Q node, and the other electrode thereof may be connected to the gate high voltage VGH.

When the enable signal Enable is applied in the LP mode, the first auxiliary transistor Tb1 is turned on such that low voltage is applied to the QB node. Accordingly, the second output transistor Tqb is turned on, the second auxiliary transistor Tb2 is turned on, and the gate high voltage VGH is applied to the Q node, so that the first output transistor Tq is turned off. Accordingly, the gate high voltage VGH is output from the stage as the second output transistor Tqb is turned on, to thereby turn off the pixels.

Figure 5C:
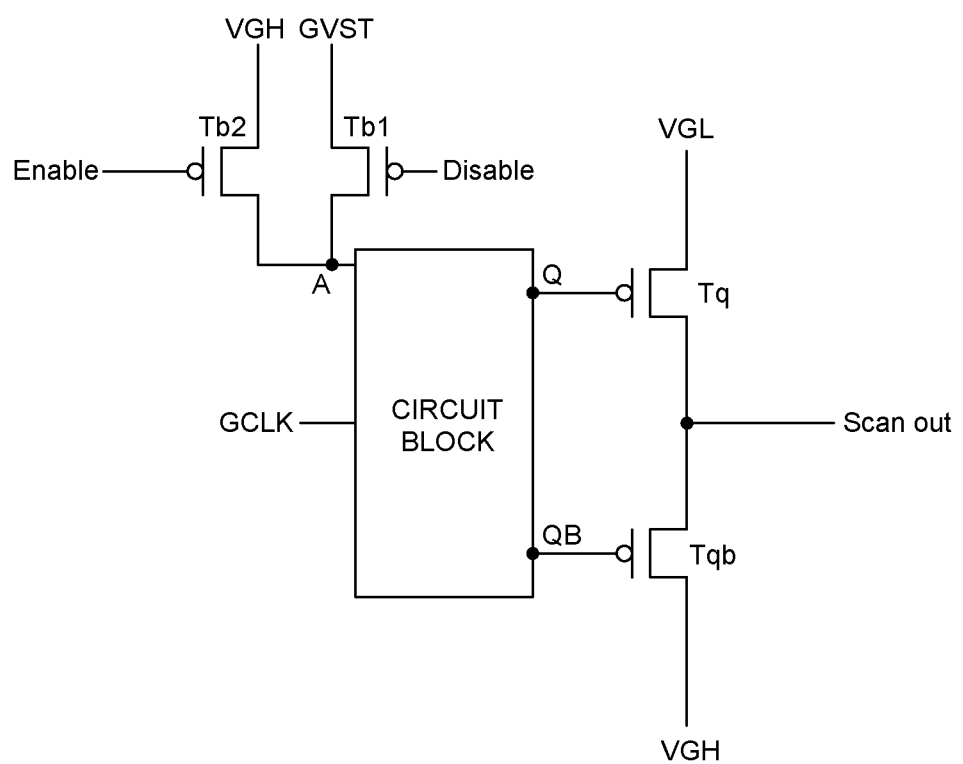
FIG. 5C is a circuit diagram of a stage according to a third exemplary embodiment of the present disclosure included in the dark areas DA of FIGS. 4A and 4B.

FIG. 5C is a circuit diagram of a scan stage according to a third exemplary embodiment of the present disclosure included in the dark areas DA of FIGS. 4A and 4B.

The circuit of the stage includes a first output transistor Tq, a second output transistor Tqb, and a circuit block CIRCUIT BLOCK for transmitting signals to the Q node and the QB node. The circuit block may be configured with a circuit capable of causing the Scan Out signal to be the same as the signal input to the circuit block at Node A.

In order to output high voltage from the stage, a circuit consisting of the first auxiliary transistor Tb1 and the second auxiliary transistor Tb2 may be disposed at a node A where an input signal to the circuit block is applied. An electrode of the second auxiliary transistor Tb2 is connected to the gate high voltage VGH, and the gate electrode thereof is connected to the enable line. An electrode of the first auxiliary transistor Tb1 is connected to the gate start pulse voltage GVST, and the gate electrode thereof connected to the disable line. The other electrode of the first auxiliary transistor Tb1 and the other electrode of the second auxiliary transistor Tb2 are connected to each other and connected to the input terminal of the circuit block.

When an enable signal is applied in the LP mode, the second auxiliary transistor Tb2 is turned on so that the gate high voltage VGH is input to the node A of the circuit block. Node Q is driven to a high voltage to turn off output transistor Tq and node QB is driven to a low voltage to turn on output transistor Tqb. Accordingly, the Scan Out signal output from the stage becomes high voltage VGH, so that the pixels can be turned off.

In the circuits shown in FIGS. 5A, 5B and 5C, in order to control the signals output from the stages disposed in the rows including pixels to be turned off, auxiliary transistors are disposed in the circuit of the stage, such that the number of the pixels to be driven can be reduced while obtaining a sufficient pixel compensation time, thereby driving the display panel at high speed.

The gate low voltage VGL, the gate high voltage VGH and the gate clock signal GCLK mentioned with respect to FIGS. 5A, 5B and 5C may be substituted with an emission low voltage VEL, an emission high voltage VEH, and an emission clock signal ECLK, respectively. That is, the circuit diagrams of FIGS. 5A, 5B and 5C may be applied to the emission stages as well.

Figure 6A:
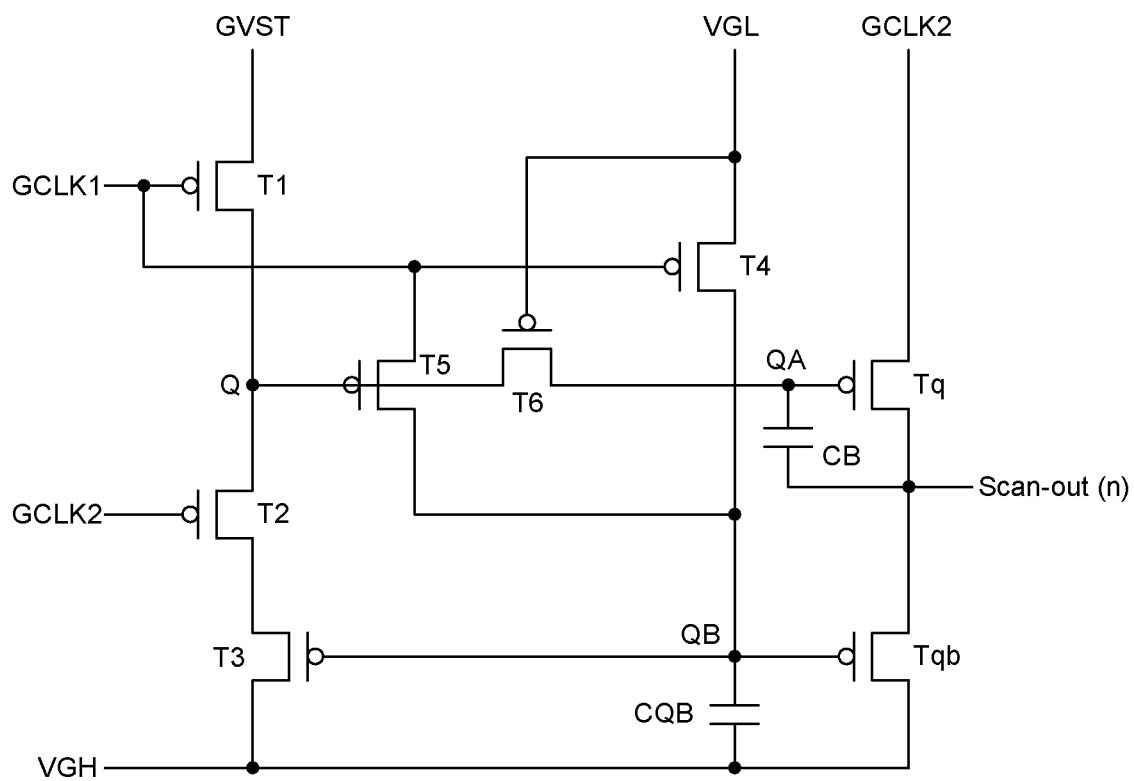
FIG. 6A is a circuit diagram of a scan stage according to an exemplary embodiment of the present disclosure included in the peripheral area PA of FIGS. 4A and 4B.

FIG. 6A is a circuit diagram of a scan stage according to an exemplary embodiment of the present disclosure included in the peripheral area PA of FIGS. 4A and 4B.

The nth scan stage for applying a signal to the pixel in the nth row may include a first output transistor Tq, a second output transistor Tqb, six transistors and two capacitors. The scan stage is driven with two gate clock signals GCLK1 and GCLK2, and a gate start pulse voltage GVST. The first transistor T1 to the sixth transistor T6 can control the output signal Scan-out (n) from the scan stage by applying high voltage or low voltage differently to the QA node that is the gate electrode of the first output transistor Tq and the QB node that is the gate electrode of the second output transistor Tqb. When the scan stage is not disposed in the first row, the input terminal of the gate start pulse voltage GVST may be an input terminal receiving the output signal from the previous scan stage. In addition, at the moment when the scan stage provides the output signal, the voltage at the Q node decreases lower than the gate low voltage VGL by bootstrapping. When this happens, the first transistor T1, the second transistor T2 and the fifth transistor T5 connected to the Q node may be affected and accordingly the threshold characteristic may be greatly biased. In view of the above, by disposing the sixth transistor T6 to thereby improve the reliability of the first transistor T1, the second transistor T2, and the fifth transistor T5 that may be lowered by the bias stress. The sixth transistor T6 serves as a buffer against bias stress and is turned on all the time as its gate electrode is connected to the gate low voltage VGL, such that the voltage at the QA node can be maintained equal to the voltage at the Q node.

Therefore, the pixels in the rows connected to the scan stages can receive a normal scan signal (gate signal) to display images.

Figure 6B:
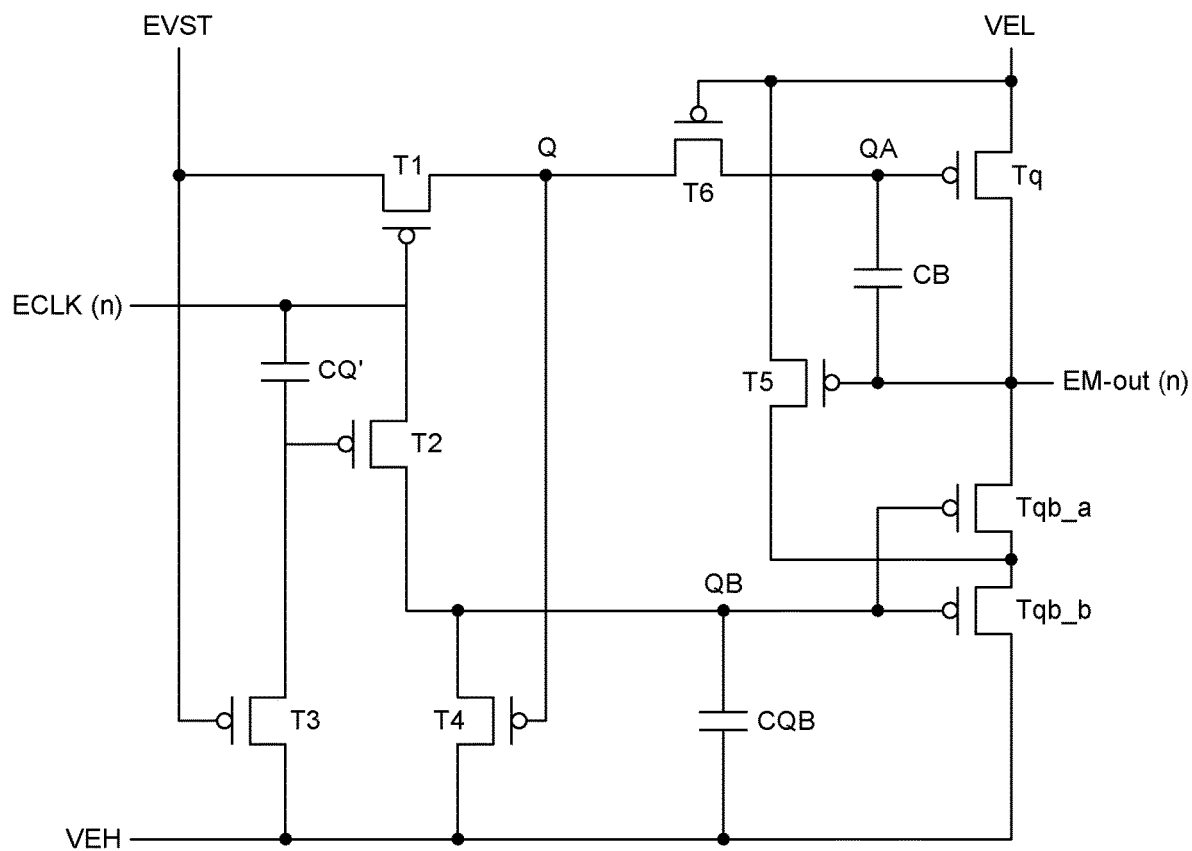
FIG. 6B is a circuit diagram of an emission stage according to an exemplary embodiment of the present disclosure included in the peripheral area PA of FIGS. 4A and 4B.

FIG. 6B is a circuit diagram of an emission stage according to an exemplary embodiment of the present disclosure included in the peripheral area PA of FIGS. 4A and 4B.

The nth emission stage for applying a signal to the pixel in the nth row may include a first output transistor Tq, a second output transistor Tqb, six transistors and three capacitors. The emission stage is driven with an emission clock signal ECLK(n) and an emission start pulse voltage EVST. The first transistor T1 to the sixth transistor T6 can control the output signal EM-out(n) from the emission stage by applying high voltage or low voltage differently to the QA node that is the gate electrode of the first output transistor Tq and the QB node that is the gate electrode of the second output transistor Tqb. The second output transistor Tqb may include two second output transistors Tqb_a and Tqb_b connected in series. The drain-source voltage Vds of the second output transistor Tqb during one frame is applied as the difference between the emission high voltage VEH and the emission low voltage VEL, and thus a high junction stress is exerted. Therefore, in order to improve the reliability of the second output transistor Tqb, it is divided into two second output transistors Tqb_a and Tqb_b, and the emission low voltage VEL is applied to the intermediate node between the two second output transistors Tqb_a and Tqb_b by using the fifth transistor T5. By doing so, it is possible to reduce the drain-source voltage Vds of the second output transistor Tqb.

Therefore, the pixels in the rows connected to the emission stages can receive a normal emission signal to display images.

Figure 7A:
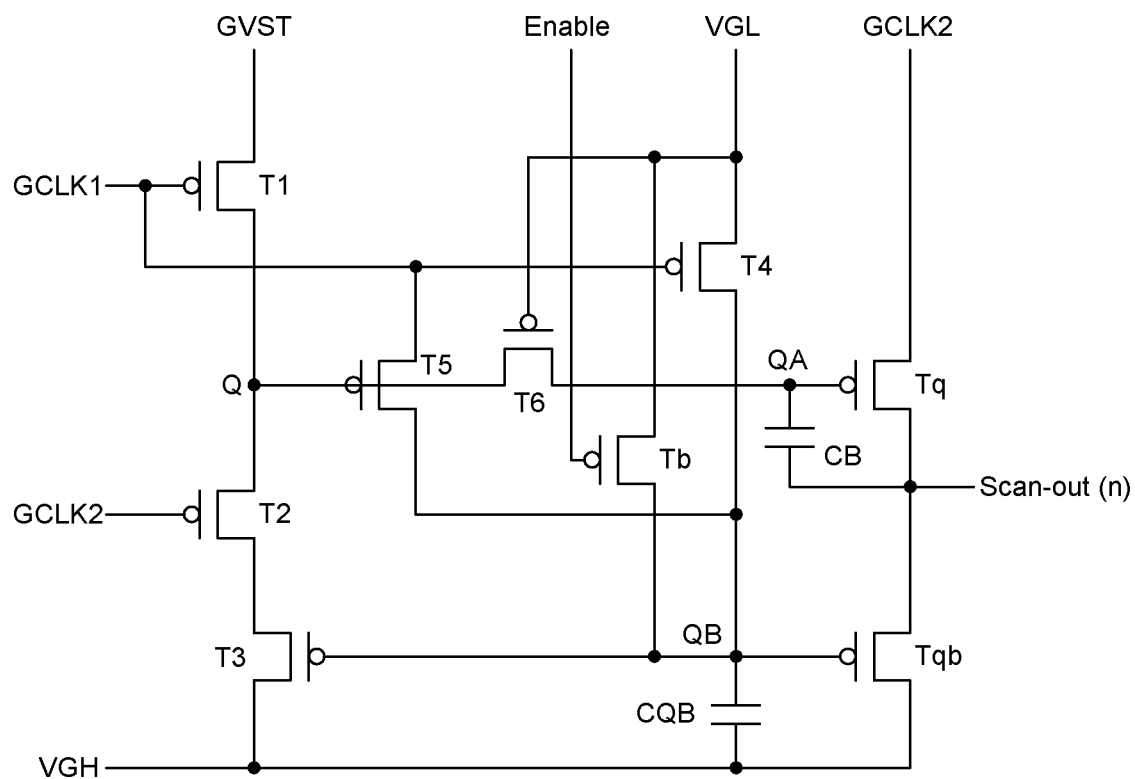
FIG. 7A is a circuit diagram of a scan stage according to a first exemplary embodiment of the present disclosure for disposing the circuit of the FIG. 6A in the dark areas DA.

FIG. 7A is a circuit diagram of a scan stage according to a first exemplary embodiment of the present disclosure for disposing the circuit of the FIG. 6A in the dark areas DA.

By further disposing an auxiliary transistor Tb in the circuit shown in FIG. 6A, it is possible to provide an output signal Scan-out (n) that can turn off the pixels from the scan stage when an enable signal Enable is applied in the LP mode.

The gate electrode of the auxiliary transistor Tb is connected to the enable line, another electrode thereof is connected to the gate low voltage VGL, and the other electrode thereof is connected to the QB node. When low voltage is applied to the enable line, the auxiliary transistor Tb is turned on to apply the gate low voltage VGL to the QB node. The third transistor T3 and the second output transistor Tqb are turned on by the gate low voltage VGL applied to the QB node, such that the gate high voltage VGH is output as an output signal Scan-out (n) from the scan stage. Since the sixth transistor T6 is turned on all the time by the gate low voltage VGL, the voltages at the Q node maintains equal to the voltage at the QA node. In addition, the gate high voltage VGH is input to the Q node and the QA node as the third transistor T3 and the second transistor T2 are turned on, such that the fifth transistor T5 and the first output transistor Tq are turned off.

Figure 7B:
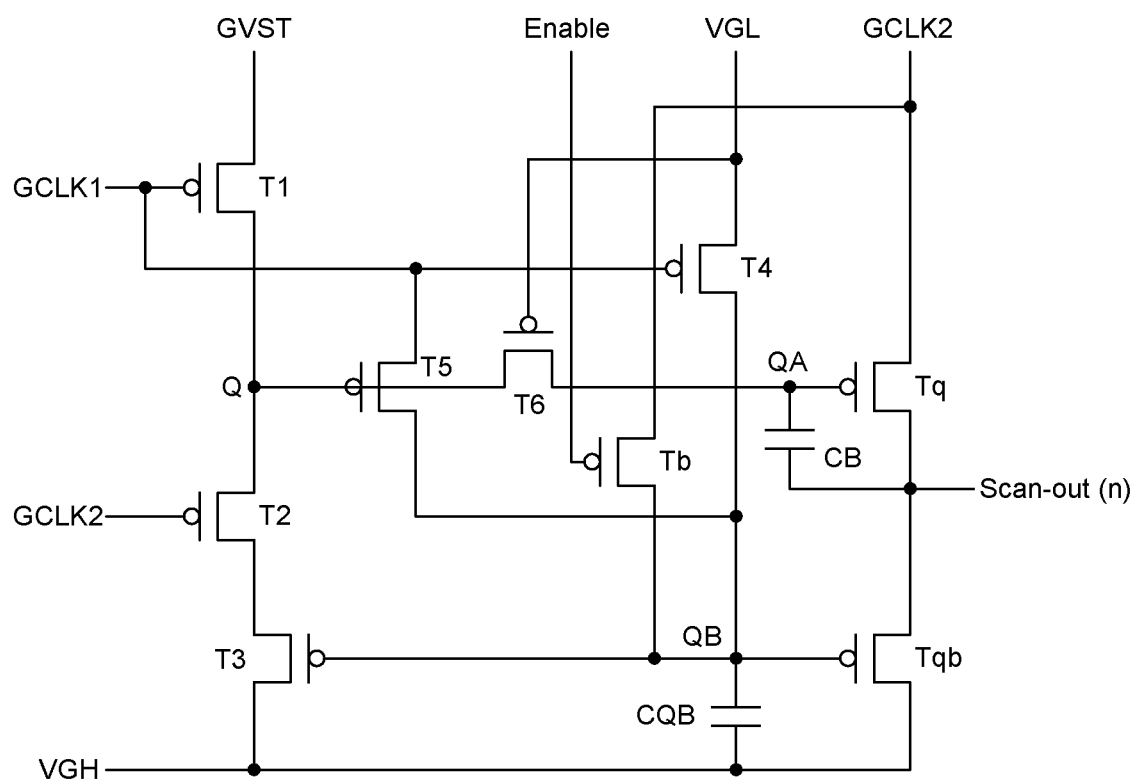
FIG. 7B is a circuit diagram of a scan stage according to a second exemplary embodiment of the present disclosure for disposing the circuit of the FIG. 6A in the dark areas DA.

FIG. 7B is a circuit diagram of a scan stage according to a second exemplary embodiment of the present disclosure for disposing the circuit of the FIG. 6A in the dark areas DA.

FIG. 7B is a modification of the circuit diagram of FIG. 7A. An electrode of an auxiliary transistor Tb is connected to a gate clock signal 2 GCLK2 instead of the gate low voltage VGL. Since the gate clock signal 2 GCLK2 also includes low voltage like the gate low voltage VGL, the same function can be performed by using the low voltage.

The connective relationships of the other components than the auxiliary transistor Tb are identical to those in FIG. 7A, and thus description thereof will be omitted.

Accordingly, in the circuits shown in FIGS. 7A and 7B, auxiliary transistors for turning on the output transistors connected to the gate high voltage are disposed in the scan stage, such that the pixels in the row connected to the scan stage are turned off when the enable signal is applied. As a result, the number of pixels to be driven can be reduced while obtaining a sufficient pixel compensation time, thereby driving the display panel at high speed.

Figure 8A:
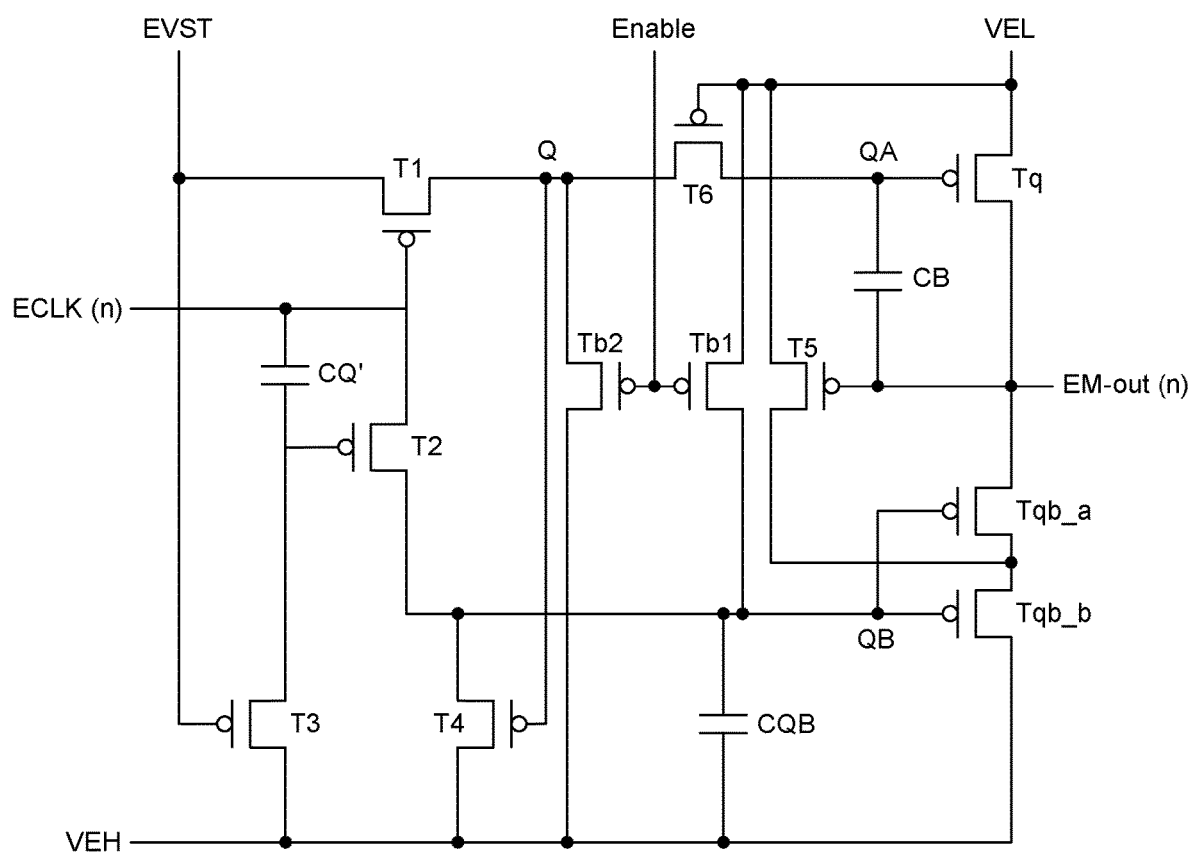
FIG. 8A is a circuit diagram of an emission stage according to a first exemplary embodiment of the present disclosure for disposing the circuit of the FIG. 6B in the dark areas DA.

FIG. 8A is a circuit diagram of an emission stage according to a first exemplary embodiment of the present disclosure for disposing the circuit of the FIG. 6B in the dark areas DA.

By further disposing a first auxiliary transistor Tb1 and a second auxiliary transistor Tb2 in the circuit shown in FIG. 6B, it is possible to provide an output signal EM-out (n) that can turn off the pixels from the emission stage when an enable signal Enable is applied in the LP mode.

The gate electrode of the first auxiliary transistor Tb1 is connected to the gate electrode of the second auxiliary transistor Tb2 and is connected to the enable line. An electrode of the first auxiliary transistor Tb1 is connected to the emission low voltage VEL, and the other electrode thereof is connected to the QB node. In addition, an electrode of the second auxiliary transistor Tb2 is connected to the Q node, and another electrode thereof is connected to the emission high voltage VEH.

When low voltage is applied to the enable line, the first auxiliary transistor Tb1 and the second auxiliary transistor Tb2 are turned on, such that the emission low voltage VEL is applied to the QB node via the first auxiliary transistor Tb1, and the emission high voltage VEH is applied to the Q node via the second auxiliary transistor Tb2. In this case, the sixth transistor T6 is turned on all the time by the emission low voltage VEL such that the voltage at the Q node is equal to the voltage at the QA node. Therefore, the emission high voltage VEH is applied to the QA node so that the first output transistor Tq is turned off. Then, the second output transistors Tqb_a and Tqb_b are turned on by the voltage at the QB node, such that the emission high voltage VEH is output as the output signal EM-out (n) from the emission stage. In addition, the fourth transistor T4 is turned off by the Q node, and the first transistor T1 and the third transistor T3 are not turned on since they do not receive the emission start pulse voltage EVST by the first control transistor T12 shown in FIG. 4A. Since the gate electrode of the second transistor T2 is floating as the third transistor T3 is turned off, the second transistor T2 is turned on/off according to the emission clock signal ECLK (n), but the QB node at the emission high voltage VEH is not affected.

Accordingly, by disposing the first auxiliary transistor Tb1 and the second auxiliary transistor Tb2 in the emission stage disposed in the row to turnoff the pixels such that the gate electrode of the first auxiliary transistor Tb1 is connected to the gate electrode of the second auxiliary transistor Tb2 to receive the enable signal Enable, it is possible to turn off the pixels in the row connected to the emission stage when the enable signal is applied. As a result, the number of the pixels to be driven can be reduced while obtaining a sufficient pixel compensation time, thereby driving the display panel at high speed.

Figure 8B:
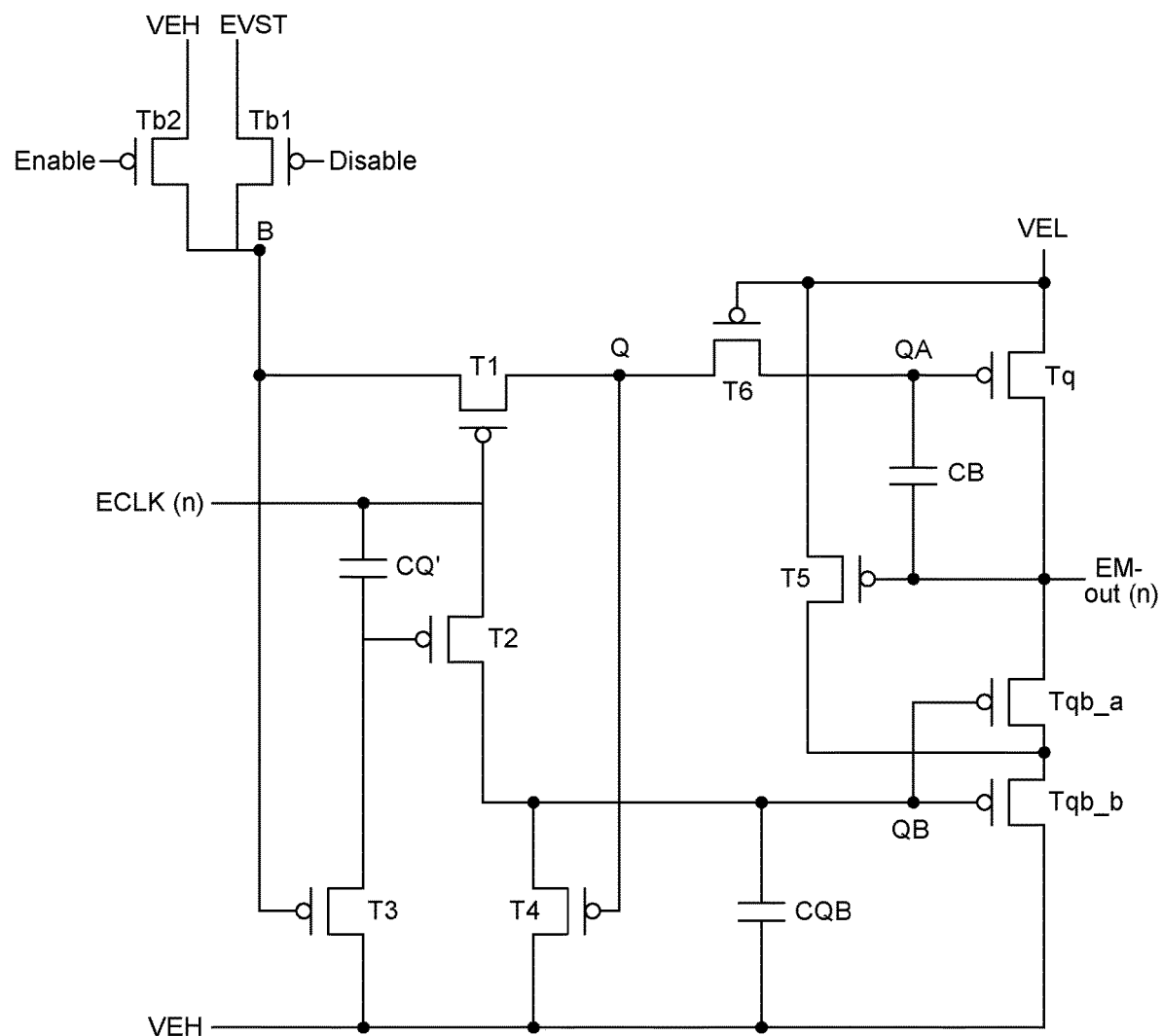
FIG. 8B is a circuit diagram of an emission stage according to a second exemplary embodiment of the present disclosure for disposing the circuit of the FIG. 6B in the dark areas DA.

FIG. 8B is a circuit diagram of an emission stage according to a second exemplary embodiment of the present disclosure for disposing the circuit of the FIG. 6B in the dark areas DA.

By further disposing a first auxiliary transistor Tb1 and a second auxiliary transistor Tb2 in the input terminal of the emission start pulse voltage EVST of the circuit shown in FIG. 6B, it is possible to provide an output signal EM-out (n) that can turn off the pixels from the emission stage when an enable signal Enable is applied in the LP mode.

In FIG. 8B, the output signal EM-out (n) is determined according to the input signal, and thus the pixels can be turned off by applying high voltage as the input signal to output high voltage as the output signal EM-out (n). In detail, an electrode of the first auxiliary transistor Tb1 and an electrode of the second auxiliary transistor Tb2 are connected to the input terminal to which the input signal is applied, and the gate electrode of the first auxiliary transistor Tb1 is connected to a Disable line, and another electrode thereof is connected to the emission start pulse voltage EVST. In addition, the gate electrode of the second auxiliary transistor Tb2 is connected to the Enable line while another electrode thereof is connected to the emission high voltage VEH. Accordingly, in the LP mode, low voltage is applied to the enable line while high voltage is applied to the disable line, such that the first auxiliary transistor Tb1 is turned off while the second auxiliary transistor Tb2 is turned on. Accordingly, the emission high voltage VEH is applied to the node B, such that the voltage output from the emission stage is at high level.

Accordingly, by disposing the first auxiliary transistor Tb1 and the second auxiliary transistor Tb2 at the input terminal of the emission start pulse voltage EVST of the emission stage of FIG. 6B disposed in the row to turn off the pixels, it is possible to turn off the pixels in the row connected to the emission stage when the enable signal is applied. As a result, the number of the pixels to be driven can be reduced while obtaining pixel compensation time, thereby driving the display panel at high speed.

Although the transistors shown in the circuit diagrams described above are p-type transistors, they may be n-type transistors in other implementations.

In addition, when the scan stages or the emission stages shown in FIGS. 6A, 6B, 7A, 7B, 8A and 8B are not located in the first row, the input terminal of the gate start pulse voltage GVST or the emission start pulse EVST may be an input terminal receiving an output signal from the previous scan stage or the previous emission stage.

The exemplary embodiments of the present disclosure can also be described as follows:

According to an aspect of the present disclosure, a display panel includes a substrate comprising a first area and a second area, pixels in a plurality of rows on the substrate, a plurality of gate lines for providing gate signals to the pixels in the plurality of rows, and a gate driver for driving the plurality of gate lines. The gate driver includes transistors for turning off pixels connected to the row disposed in the second area. By turning off the pixels in the plurality of rows disposed in the dark areas, the number of the pixels to be driven can be reduced while obtaining pixel compensation time, thereby driving the display panel at high speed The display panel may further include an enable line and a disable line for controlling the transistors.

The gate driver may include a $k^{th}$ stage for providing a signal input to one of the plurality of gate lines in a $k^{th}$ row, wherein k is a natural number, and wherein the transistors comprise a first control transistor for controlling a start pulse voltage input to a first stage, and a cut-off transistor for blocking an output signal from the $k^{th}$ stage from being input to a $(k+1)^{th}$ stage.

The transistors may further include a second control transistor for controlling a start pulse voltage input to the $(k+1)^{th}$ stage at an input terminal of the $(k+1)^{th}$ stage.

The $k^{th}$ stage may include a scan stage and/or an emission stage.

The $k^{th}$ stage may include a first output transistor and a second output transistor that are alternately turned on; and a auxiliary transistor for providing an output signal for turning off pixels connected to the $k^{th}$ stage, and wherein the first output transistor and the second output transistor provide a gate high voltage and the a gate low voltage, respectively.

An electrode of the auxiliary transistor may be connected to a gate electrode of the first output transistor or the second output transistor, and another electrode of the auxiliary transistor may be connected to a line providing a voltage different from a voltage supplied by the first output transistor or the second output transistor connected to the electrode of the auxiliary transistor.

The auxiliary transistor may include a first auxiliary transistor and a second auxiliary transistor, and wherein a gate electrode of the first auxiliary transistor and a gate electrode of the second auxiliary transistor may be connected each other and received the same signal from the enable line.

The $k^{th}$ stage may be configured with a circuit for outputting the same signal as the input signal to the $k^{th}$ stage, wherein the auxiliary transistor may controls the input signal to the $k^{th}$ stage, and applies a signal selected by a signal of the enable line or the disable line to the circuit.

According to an another aspect of the present disclosure, a display panel includes a substrate comprising a plurality of gate lines for providing gate signals to pixels in a plurality of rows, a gate driver for driving the plurality of gate lines, wherein the gate driver comprises a $k^{th}$ stage for providing a signal input to one of the gate lines in a $k^{th}$ row, wherein k is a natural number equal to or larger than two, and a cut-off transistor for blocking an output signal from a $(k-1)^{th}$ stage input to the $k^{th}$ stage. By turning off the pixels after the $k^{th}$ row, the number of the pixels to be driven can be reduced while obtaining pixel compensation time, thereby driving the display panel at high speed.

The display panel may further include a disable line for providing a disable signal to be input to the cut-off transistors.

The stage may include a scan stage and/or an emission stage.

The $k^{th}$ stage may include a first output transistor and a second output transistor that are alternately turned on, and an auxiliary transistor for providing an output signal for turning off pixels connected to the $k^{th}$ stage, and wherein the first output transistor and the second output transistor provide a gate high voltage and the a gate low voltage, respectively.

An electrode of the auxiliary transistor may be connected to a gate electrode of the first output transistor or the second output transistor, and another electrode of the auxiliary transistor may be connected to a line providing a voltage different from a voltage supplied by the first output transistor or the second output transistor connected to the electrode of the auxiliary transistor.

The auxiliary transistor may include a first auxiliary transistor and a second auxiliary transistor, and wherein a gate electrode of the first auxiliary transistor and a gate of the second auxiliary transistor are may be connected each other and received a same signal from the enable line.

The $k^{th}$ stage may be configured with a circuit for outputting the same signal as the input signal to the $k^{th}$ stage, wherein the auxiliary transistor may controls the input signal to the $k^{th}$ stage, and applies a signal selected by a signal of the enable line or the disable line to the circuit.

According to a yet another aspect of the present disclosure, a gate driver includes a scan driver and an emission driver, wherein the scan driver comprises n scan stages, and the emission driver comprises n emission stages, wherein n is a natural number, wherein the gate driver, in each of the scan driver and the emission driver, comprises a first cut-off transistor that blocks an output signal from a $(j-1)^{th}$ scan stage or a $(j-1)^{th}$ emission stage, wherein j is a natural number satisfying $1 \leq j < n$; a second cut-off transistor that blocks an output signal from a $k^{th}$ scan stage or a $k^{th}$ emission stage, wherein k is a natural number satisfying $1 \leq j < k \leq n$; and a control transistor that controls a start pulse voltage to a $(k+1)^{th}$ scan stage or a $(k+1)^{th}$ emission stage. By turning off the pixels from the pixel in the $j^{th}$ row to the pixel in the $k^{th}$ row, the number of the pixels to be driven can be reduced while obtaining pixel compensation time, thereby driving the display panel at high speed.

Each of the $j^{th}$ to $k^{th}$ scan stages may include a first output transistor and a second output transistor alternately turned on, wherein the first output transistor is connected to a line for providing a gate clock signal, wherein the second output transistor is connected to a line for providing a gate high voltage, and an auxiliary transistor having an electrode connected to a gate electrode of the second output transistor, another electrode connected to a line for providing a gate low voltage or the line for providing the gate clock signal.

Each of the $j^{th}$ to $k^{th}$ emission stages may include a first output transistor and a second output transistor alternately turned on, wherein the gate driver comprises a first auxiliary transistor connected to an electrode of the first output transistor and to a gate electrode of the second output transistor, and a second auxiliary transistor connected to a gate electrode of the first output transistor and an electrode of the second output transistor, and wherein a gate electrode of the first auxiliary transistor is connected to a gate electrode of the second auxiliary transistor to receive an enable signal.

Each of the $j^{th}$ to $k^{th}$ emission stages may be configured with a circuit for outputting the same signal as the input signal to the $j^{th}$ to $k^{th}$ stages, wherein each of the emission stages comprises a auxiliary transistor, wherein the auxiliary transistor applies a signal selected by a signal of an enable line or a disable line to the $j^{th}$ to $k^{th}$ emission stages.

In one embodiment, a display panel comprises a first plurality of pixels in first pixel rows corresponding to a first plurality of gate lines, a second plurality of pixels in second pixel rows corresponding to a second plurality of gate lines, and a gate driver coupled to the first plurality of gate lines and the second plurality of gate lines. The gate driver is configured to, in a first display mode, turn on the first plurality of pixels and the second plurality of pixels, and in a second display mode, turn off the first plurality of pixels and turn on the second plurality of pixels.

In one or more embodiments, in the first display mode, the gate driver sequentially drives a gate signal to the first plurality of gate lines and the second plurality of gate lines and in the second display mode, the gate driver sequentially drives a gate signal to the second plurality of gate lines, and applies a DC voltage to the first plurality of gate lines.

In one or more embodiments, the display panel may further comprise a third plurality of pixels in third pixel rows corresponding to a third plurality of gate lines. In the first display mode, the gate driver turns on the first plurality of pixels, the second plurality of pixels and the third plurality of pixels. In the second display mode, the gate driver turns off the first plurality of pixels and the third plurality of pixels, and turns on the second plurality of pixels.

In one or more embodiments, the gate driver may comprise a plurality of cascaded driver stages that include a first plurality of cascaded driver stages to drive at least the first plurality of gate lines and a second plurality of cascaded driver stages to drive at least the second plurality of gate lines, and a first cut off transistor to selectively block an output signal of a last driver stage of the first plurality of cascaded driver stages from reaching an input of an initial driver stage of the second plurality of cascaded driver stages in the second display mode.

In one or more embodiments, in the first display mode, the first cut off transistor passes the output signal of the last driver stage of the first plurality of cascaded driver stages to the input of the initial driver stage of the second plurality of cascaded driver stages.

In one or more embodiments, the display panel may further include a third plurality of pixels in third pixel rows corresponding to a third plurality of gate lines. The plurality of cascaded driver stages may further comprise a third plurality of cascaded driver stages to drive at least the third plurality of gate lines. The gate driver may further comprises a second cut off transistor to selectively block an output signal of a last driver stage of the second plurality of cascaded driver stages from reaching an input of an initial driver stage of the third plurality of cascaded driver stages in the second display mode.

In one or more embodiments, the display panel may further comprise a start pulse voltage line to carry a start pulse voltage and a first control transistor to selectively control whether the start pulse voltage is provided from the start pulse voltage line to an initial driver stage of the first plurality of cascaded driver stages.

In one or more embodiments, the display panel may further comprise a second control transistor to selectively control whether the start pulse voltage is provided from the start pulse voltage line to the initial driver stage of the second plurality of cascaded driver stages.

In one or more embodiments, at least one driver stage of the first plurality of cascaded driver stages may comprise a first output transistor and a second output transistor that are alternately turned on, the first output transistor connected to a gate high voltage line and the second output transistor connected to a gate low voltage line. A first auxiliary transistor has a gate connected to an enable line, an electrode connected to the gate low voltage line, and another electrode connected to a gate of the first output transistor.

In one or more embodiments, the at least one driver stage of the first plurality of cascaded driver stages may comprise a second auxiliary transistor having a gate connected to the enable line, an electrode connected to a gate of the second output transistor, and another electrode connected to the gate high voltage line.

In one or more embodiments, at least one driver stage of the first plurality of cascaded driver stages may comprise a circuit block causing an output of the driver stage to be same as an input to the circuit block, and an auxiliary transistor having a gate connected to an enable line, an electrode connected to a gate high voltage line, and another electrode connected to the input of the circuit block.

In one or more embodiments, at least one driver stage of the second plurality of cascaded driver may comprise a first output transistor and a second output transistor that are alternately turned on, the first output transistor connected to agate high voltage line and the second output transistor connected to a clock line. The driver stage may include a transistor having a gate connected to a gate low voltage line and an electrode connected to a gate of the second output transistor.

In one or more embodiments, at least one driver stage of the second plurality of cascaded driver stages may comprise a first output transistor and a second output transistor that are alternately turned on, the first output transistor connected to an emission high voltage line and the second output transistor connected to an emission low voltage line. The first output transistor may comprise a plurality of serially connected transistors having connected gate electrodes.

In one or more embodiments, at least one driver stage of the first plurality of cascaded driver stages may comprise a first output transistor and a second output transistor that are alternately turned on, the first output transistor connected to agate high voltage line and the second output transistor connected to a gate clock line. An auxiliary transistor may include a gate connected to an enable line, an electrode connected to a gate of the first output transistor, and another electrode connected to a gate low voltage line.

In one or more embodiments, at least one driver stage of the first plurality of cascaded driver stages may comprise a first output transistor and a second output transistor that are alternately turned on, the first output transistor connected to agate high voltage line and the second output transistor connected to a gate clock line. An auxiliary transistor may include a gate connected to an enable line, an electrode connected to a gate of the first output transistor, and another electrode connected to the gate clock line.

In one or more embodiments, at least one driver stage of the first plurality of cascaded driver stages may comprise a first output transistor and a second output transistor that are alternately turned on, the first output transistor connected to an emission high voltage line and the second output transistor connected to an emission low voltage line. The driver stage may include a first auxiliary transistor having a gate connected to an enable line an electrode connected to a gate of the first output transistor and another electrode connected to the emission low voltage line. The driver stage may include a second auxiliary transistor having a gate connected to the enable line and an electrode connected to the emission high voltage line.

In one or more embodiments, the first display mode is a normal display mode and the second display mode may be a virtual reality display mode.

In one or more embodiments, the gate lines may be scan lines or emission lines.

In one or more embodiments, in the second display mode, the gate driver turns on the second plurality of pixels and drives a voltage to the first plurality of pixels via the first gate lines that maintain the first plurality of pixels off throughout each corresponding frame period.

In one or more embodiment, in the second display mode, the first pixel rows are in a dark area of the display panel and the second pixel rows are in peripheral area of the display panel.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects. The scope of protection sought by the present disclosure is defined solely by the appended claims and all equivalents thereof are construed to be within the true scope of the present disclosure.

What is claimed is:

1. A display panel having a display area and a non-display area surrounding the display area comprising:
    a first plurality of pixels in first pixel rows disposed along a first edge of the display panel, the first pixel rows corresponding to a first plurality of gate lines;
    a second plurality of pixels in second pixel rows corresponding to a second plurality of gate lines;
    a third plurality of pixels in third pixel rows disposed along a second edge of the display panel that is opposite to the first edge, the third pixel rows corresponding to a third plurality of gate lines, wherein the second plurality of pixels are between the first plurality of pixels and the third plurality of pixels; and
    a gate driver coupled to the first plurality of gate lines, the second plurality of gate lines, and the third plurality of gate lines, the gate driver configured to:
        in a first display mode that displays an image, turn on the first plurality of pixels, the second plurality of pixels, and the third plurality of pixels; and
        in a second display mode that displays the image in virtual reality, turn off the first plurality of pixels and the third plurality of pixels, and turn on the second plurality of pixels such that all of the second plurality of pixels are capable of being used for displaying the image,
    wherein the gate driver comprises:
        a plurality of cascaded driver stages that include a first plurality of cascaded driver stages to drive at least the first plurality of gate lines and a second plurality of cascaded driver stages to drive at least the second plurality of gate lines, and
        a first cut off transistor to selectively block an output signal of a driver stage of the first plurality of cascaded driver stages from reaching an input of an initial driver stage of the second plurality of cascaded driver stages in the second display mode,
    wherein each of the first edge and the second edge is a periphery area of the display area adjacent to the non-display area, and
    wherein during the second display mode that displays the image in virtual reality, the display panel is fixed at a location in front of a user's eyes using a structure,
    wherein at least one driver stage of the first plurality of cascaded driver stages comprises:
        a first output transistor and a second output transistor that are alternately turned on, the first output transistor connected to a gate high voltage line and the second output transistor connected to a gate low voltage line or a clock line; and
        a first auxiliary transistor having a gate connected to an enable line, an electrode connected to the gate low voltage line or the clock line, and another electrode connected to a gate of the first output transistor.

2. The display panel of claim 1, wherein:
    in the first display mode, the gate driver sequentially drives a gate signal to the first plurality of gate lines, the second plurality of gate lines, and the third plurality of gate lines; and
    in the second display mode, the gate driver sequentially drives a gate signal to the second plurality of gate lines, and applies a DC voltage to the first plurality of gate lines and the third plurality of gate lines.

3. The display panel of claim 1, wherein in the first display mode, the first cut off transistor passes the output signal of a last driver stage of the first plurality of cascaded driver stages to the input of the initial driver stage of the second plurality of cascaded driver stages.

4. The display panel of claim 1, wherein the plurality of cascaded driver stages further comprises a third plurality of cascaded driver stages to drive at least the third plurality of gate lines,
    wherein the gate driver further comprises a second cut off transistor to selectively block an output signal of a last driver stage of the second plurality of cascaded driver stages from reaching an input of an initial driver stage of the third plurality of cascaded driver stages during the second display mode.

5. The display panel of claim 1, further comprising:
    a start pulse voltage line to carry a start pulse voltage; and
    a first control transistor to selectively control whether the start pulse voltage is provided from the start pulse voltage line to an initial driver stage of the first plurality of cascaded driver stages.

6. The display panel of claim 5, further comprising:
    a second control transistor to selectively control whether the start pulse voltage is provided from the start pulse voltage line to the initial driver stage of the second plurality of cascaded driver stages.

7. The display panel of claim 1, wherein the at least one driver stage of the first plurality of cascaded driver stages comprises:
    a second auxiliary transistor having a gate connected to the enable line, an electrode connected to a gate of the second output transistor, and another electrode connected to the gate high voltage line.

8. The display panel of claim 1,
    wherein the first output transistor comprises a plurality of serially connected transistors having connected gate electrodes.

9. The display panel of claim 1, wherein the gate lines are scan lines or emission lines.

10. The display panel of claim 1, wherein in the second display mode, the gate driver turns on the second plurality of pixels and respectively drives a voltage to the first plurality of pixels and the third plurality of pixels via the first gate lines and the third gate lines that maintain the first plurality of pixels and the third plurality of pixels off throughout each corresponding frame period.

11. The display panel of claim 1, wherein in the second display mode, the first pixel rows and the third pixel rows are in a dark area of the display panel that are along the first edge and the second edge of the display panel outside of a human viewing angle range.

12. The display panel of claim 1, wherein the first edge of the display panel and the second edge of the display panel are shorter than a third edge and a fourth edge of the display panel that are perpendicular to the first edge and the second edge.

13. The display panel of claim 1, wherein a frame period in the second display mode is shorter than a frame period of the first display mode.

14. A display panel having a display area and a non-display area surrounding the display area comprising:
- a first plurality of pixels in first pixel rows disposed along a first edge of the display panel, the first pixel rows corresponding to a first plurality of gate lines;
- a second plurality of pixels in second pixel rows corresponding to a second plurality of gate lines;
- a third plurality of pixels in third pixel rows disposed along a second edge of the display panel that is opposite to the first edge, the third pixel rows corresponding to a third plurality of gate lines, wherein the second plurality of pixels are between the first plurality of pixels and the third plurality of pixels; and
- a gate driver coupled to the first plurality of gate lines, the second plurality of gate lines, and the third plurality of gate lines, the gate driver configured to:
  - in a first display mode that displays an image, turn on the first plurality of pixels, the second plurality of pixels, and the third plurality of pixels; and
  - in a second display mode that displays the image in virtual reality, turn off the first plurality of pixels and the third plurality of pixels, and turn on the second plurality of pixels such that all of the second plurality of pixels are capable of being used for displaying the image, wherein the gate driver comprises:
- a plurality of cascaded driver stages that include a first plurality of cascaded driver stages to drive at least the first plurality of gate lines and a second plurality of cascaded driver stages to drive at least the second plurality of gate lines; and
- a first cut off transistor to selectively block an output signal of a last driver stage of the first plurality of cascaded driver stages from reaching an input of an initial driver stage of the second plurality of cascaded driver stages in the second display mode, wherein each of the first edge and the second edge is a periphery area of the display area adjacent to the non-display area, and wherein during the second display mode that displays the image in virtual reality, the display panel is fixed at a location in front of a user's eyes using a structure, wherein at least one driver stage of the first plurality of cascaded driver stages comprises:
- a circuit block causing an output of the driver stage to be same as an input to the circuit block; and
- an auxiliary transistor having a gate connected to an enable line, an electrode connected to a gate high voltage line, and another electrode connected to the input of the circuit block.

* * * * *